US007332912B2

(12) United States Patent
Pittaluga et al.

(10) Patent No.: US 7,332,912 B2
(45) Date of Patent: Feb. 19, 2008

(54) METHOD FOR CORRECTING INHOMOGENEITIES OF THE STATIC MAGNETIC FIELD, PARTICULARLY OF THE STATIC MAGNETIC FIELD GENERATED BY THE MAGNETIC STRUCTURE OF A MACHINE FOR ACQUIRING MRI IMAGE

(75) Inventors: Stefano Pittaluga, Genoa (IT); Alessandro Trequattrini, Genoa (IT); Stefano Besio, Genoa (IT)

(73) Assignee: Esaote, S.p.A., Milan (IT)

( * ) Notice: Subject to any disclaimer, the term of this patent is extended or adjusted under 35 U.S.C. 154(b) by 0 days.

(21) Appl. No.: 11/443,249

(22) Filed: May 31, 2006

(65) Prior Publication Data

US 2007/0035298 A1 Feb. 15, 2007

(30) Foreign Application Priority Data

Jul. 11, 2005 (EP) ................................. 05425499

(51) Int. Cl.
*G01V 3/00* (2006.01)
(52) U.S. Cl. ..................... 324/320; 324/307; 324/309
(58) Field of Classification Search ........ 324/300–322; 600/410–435
See application file for complete search history.

(56) References Cited

U.S. PATENT DOCUMENTS 4,633,181 A * 12/1986 Murphy-Boesch et al. . 324/322

5,006,804 A * 4/1991 Dorri et al. ................. 324/320
5,045,794 A * 9/1991 Dorri et al. ................. 324/320
7,215,123 B2 * 5/2007 Axel ........................... 324/318

FOREIGN PATENT DOCUMENTS

EP 0 431 848 A2 6/1991
EP 1 072 899 A2 1/2001

OTHER PUBLICATIONS

D.I. Hoult, and R. Deslauriers: "Accurate Shim-Coil Design and Magnet-Field Profiling by a Power-Minimization-Matrix Method," Journal of Magnetic Resonance, Series A, vol. 108, May 1994, pp. 9-20.
B. Dorri, and M.E. Vermilyea: "Passive Shimming of MR Magnets: Algorithm, Hardware, and Results," IEEE Transactions on Applied Superconductivity, vol. 3, No. 1, Mar. 1993, pp. 254-257.

(Continued)

*Primary Examiner*—Brij Shrivastav
*Assistant Examiner*—Dixomara Vargas
(74) *Attorney, Agent, or Firm*—Buchanan Ingersoll & Rooney PC

(57) ABSTRACT

An exemplary method for correcting inhomogeneities of the static magnetic field generated by the magnetic structure of a machine for acquiring nuclear magnetic resonance images includes determining the number, the position and the magnetic moment of dipoles compensating inhomogeneities of the magnetic field to be positioned on a positioning grid such that a function is minimized. The total magnetic moment of compensation dipoles for compensating the magnetic field inhomogeneity can be minimized in addition to minimizing a norm of the difference between an inhomogeneity vector of each of the magnetic field components and the linear combination of effect vectors corresponding to the magnetic field component of compensation dipoles.

39 Claims, 19 Drawing Sheets

OTHER PUBLICATIONS

F. Romeo, and D.I. Hoult: "Magnet Field Profiling: Analysis and Correcting Coil Design," Magnetic Resonance in Medicine, vol. 1, 1984, pp. 44-65.

T.F. Coleman, and Y. Li: "A Reflective Newton Method for Minimizing a Quadratic Function Subject to Bounds on Some of the Variables," Cornell University, Ithaca, NY, Dec. 7, 1992, pp. 1-37.

P.E. Gill, W. Murray, and M.H. Wright: *Practical Optimization*, Academic Press, London, UK, 1981, pp. 176-196.

G.B. Dantzig, A. Ordern, and P. Wolfe: "The Generalized Simplex Method for Minimizing a Linear Form Under Linear Inequality Restraints," Pacific Journal Math., vol. 5, 1955, pp. 183-195.

S. Mehrotra: "On the Implementation of a Primal-Dual Interior Point Method," SIAM Journal on Optimization, vol. 2, No. 4, Nov. 1992, pp. 575-601.

European Search Report issued in connection with European Application No. 05425499.0 on Apr. 19, 2006.

\* cited by examiner

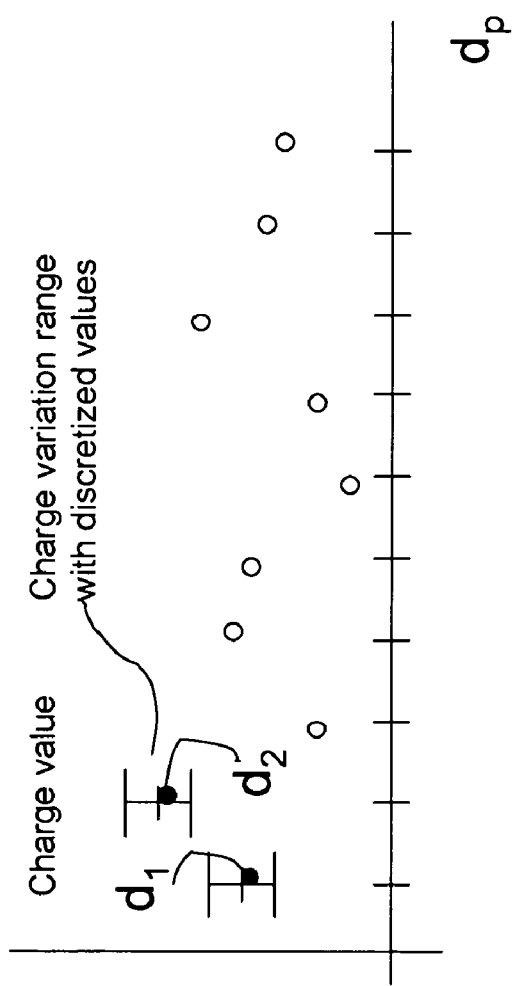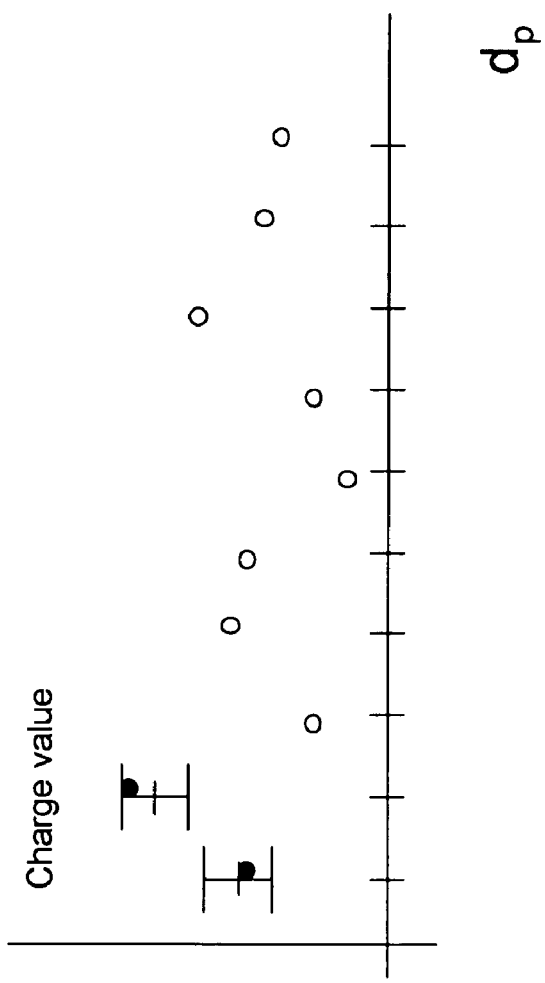

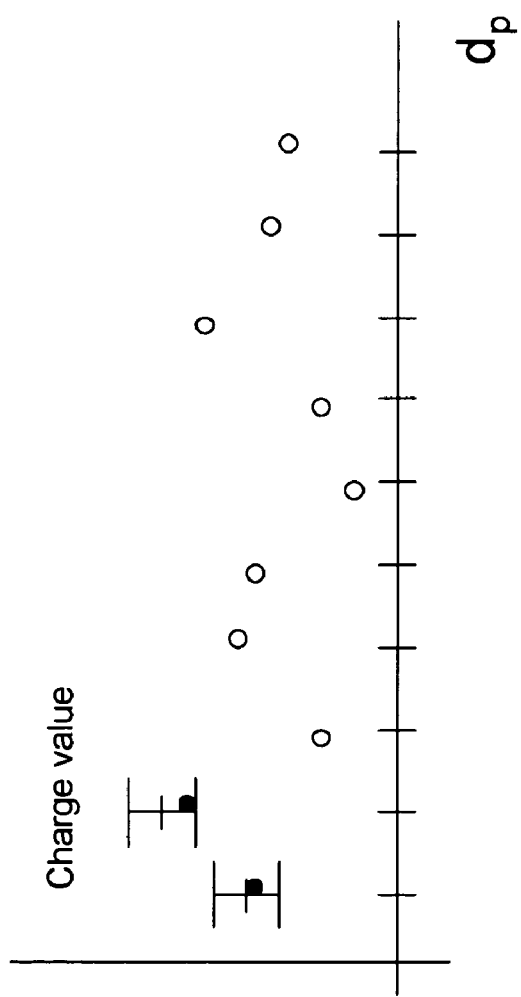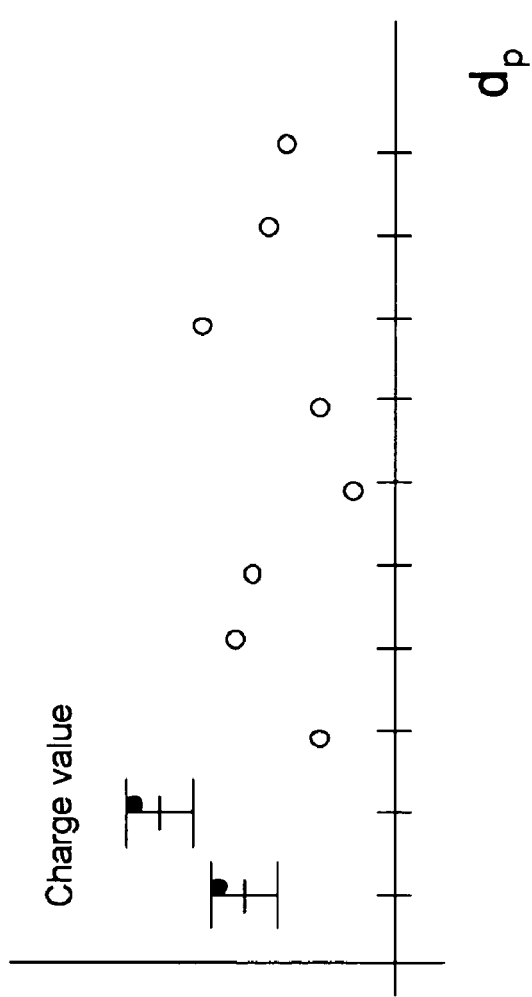

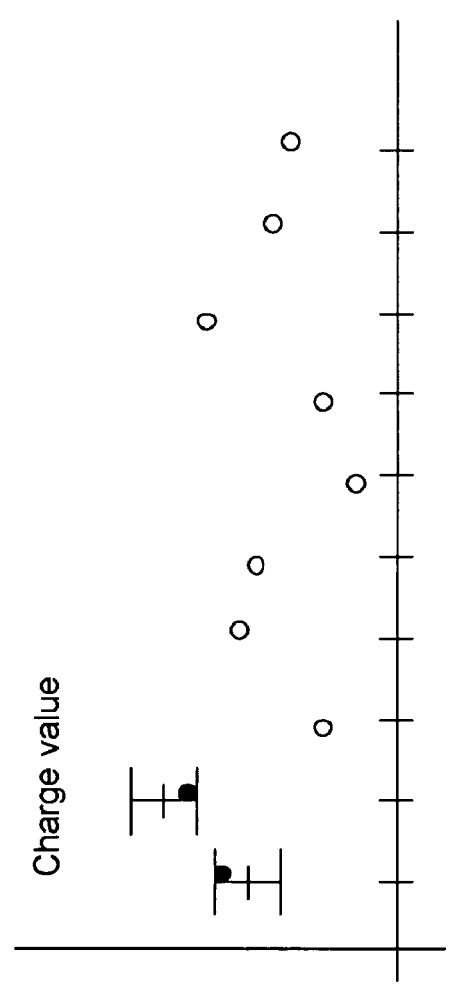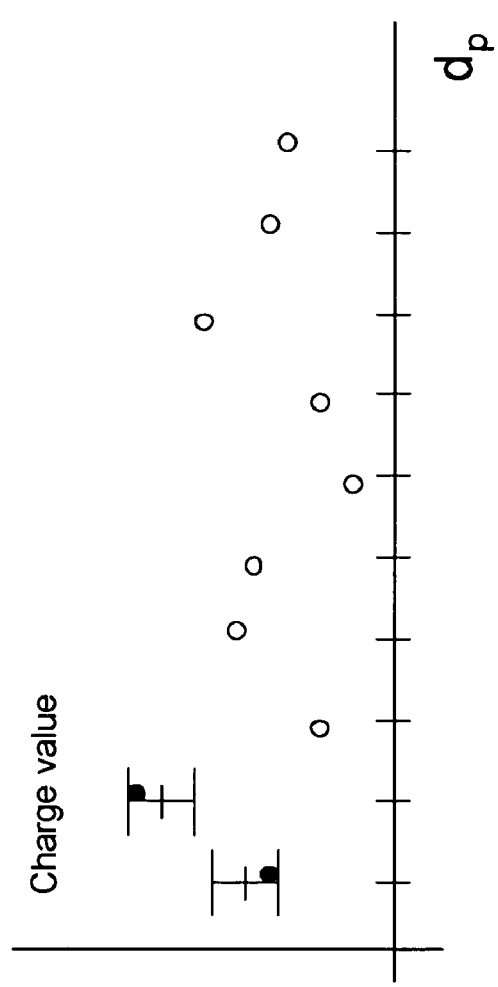

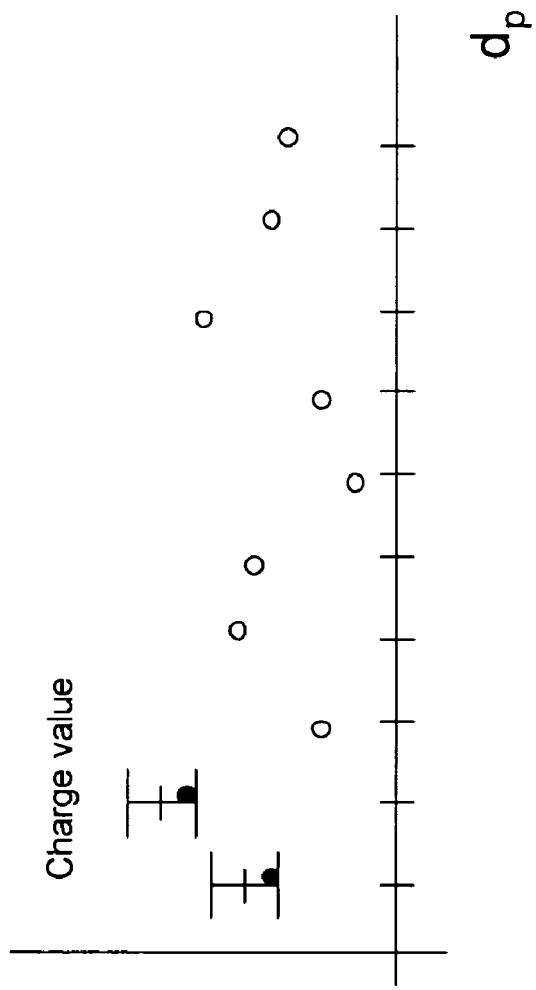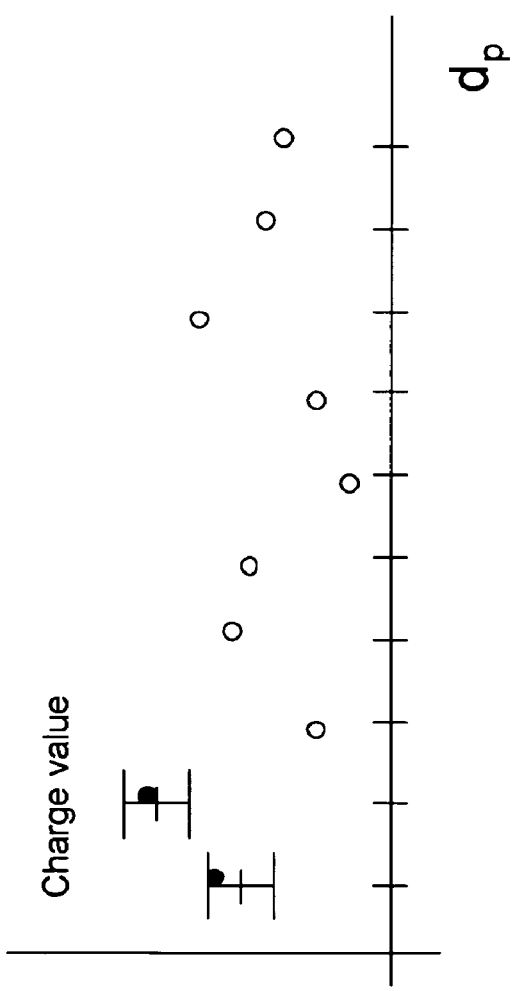

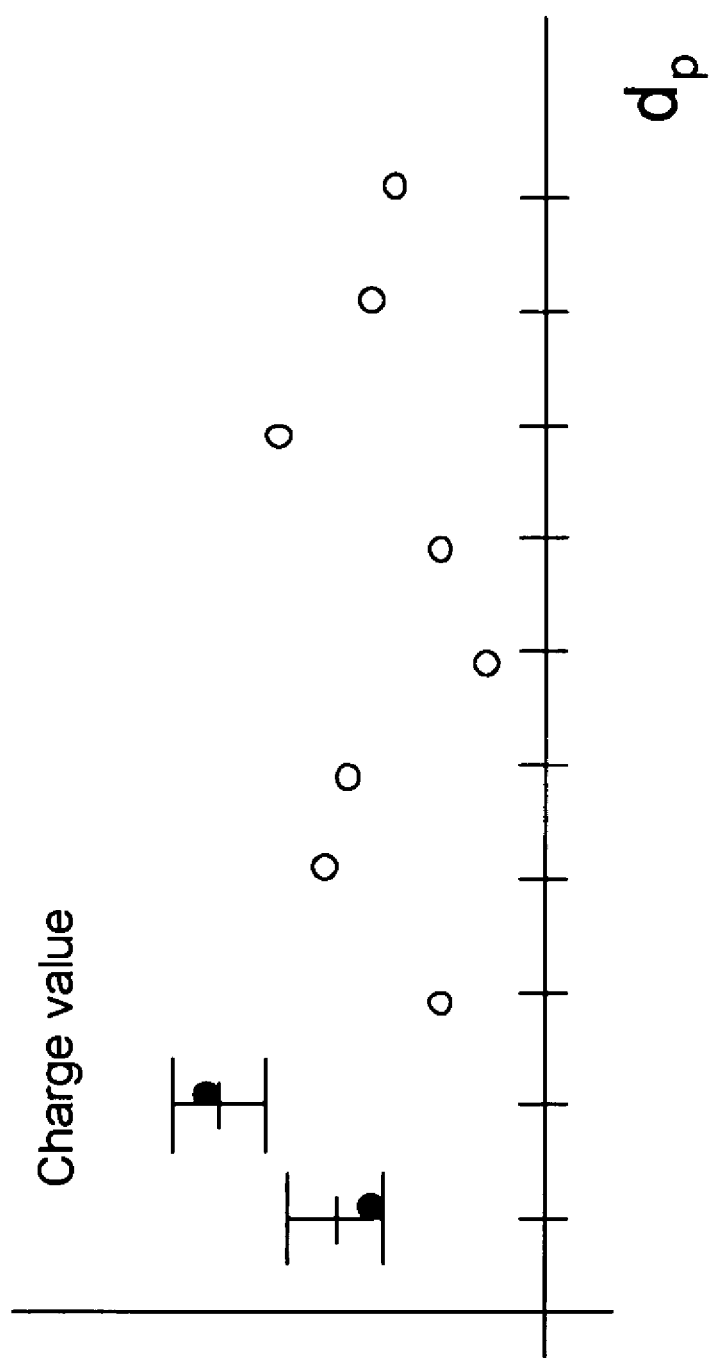

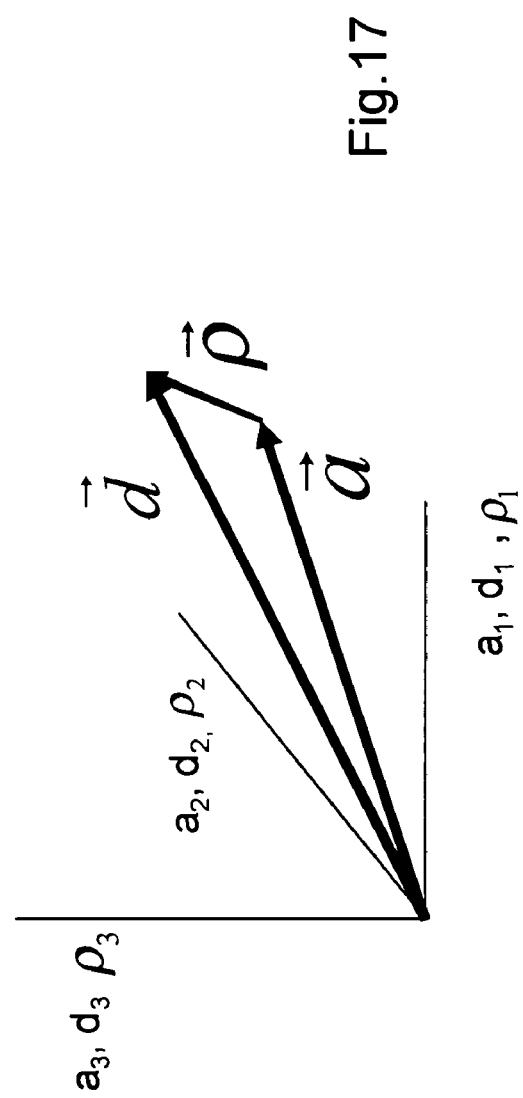
Fig.17
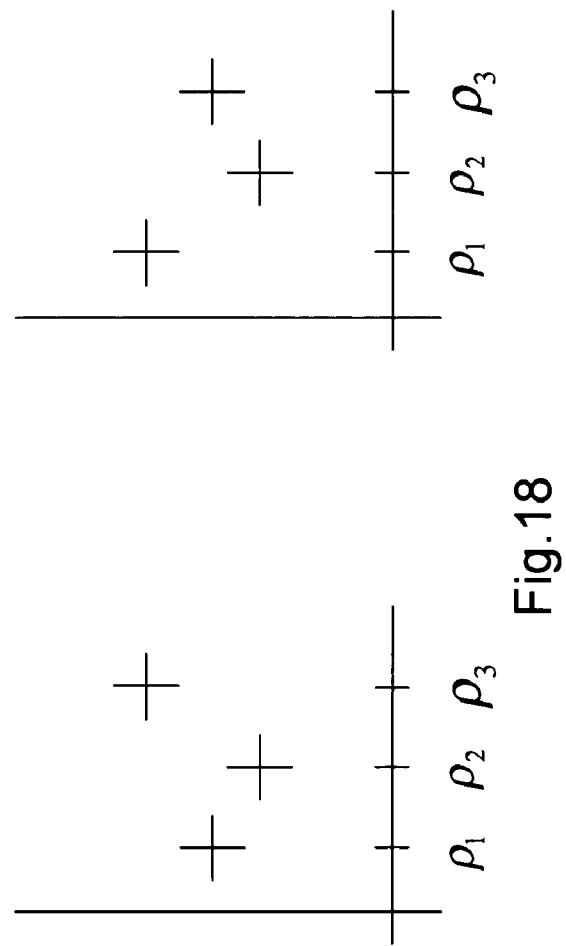
Fig.19
Fig.18

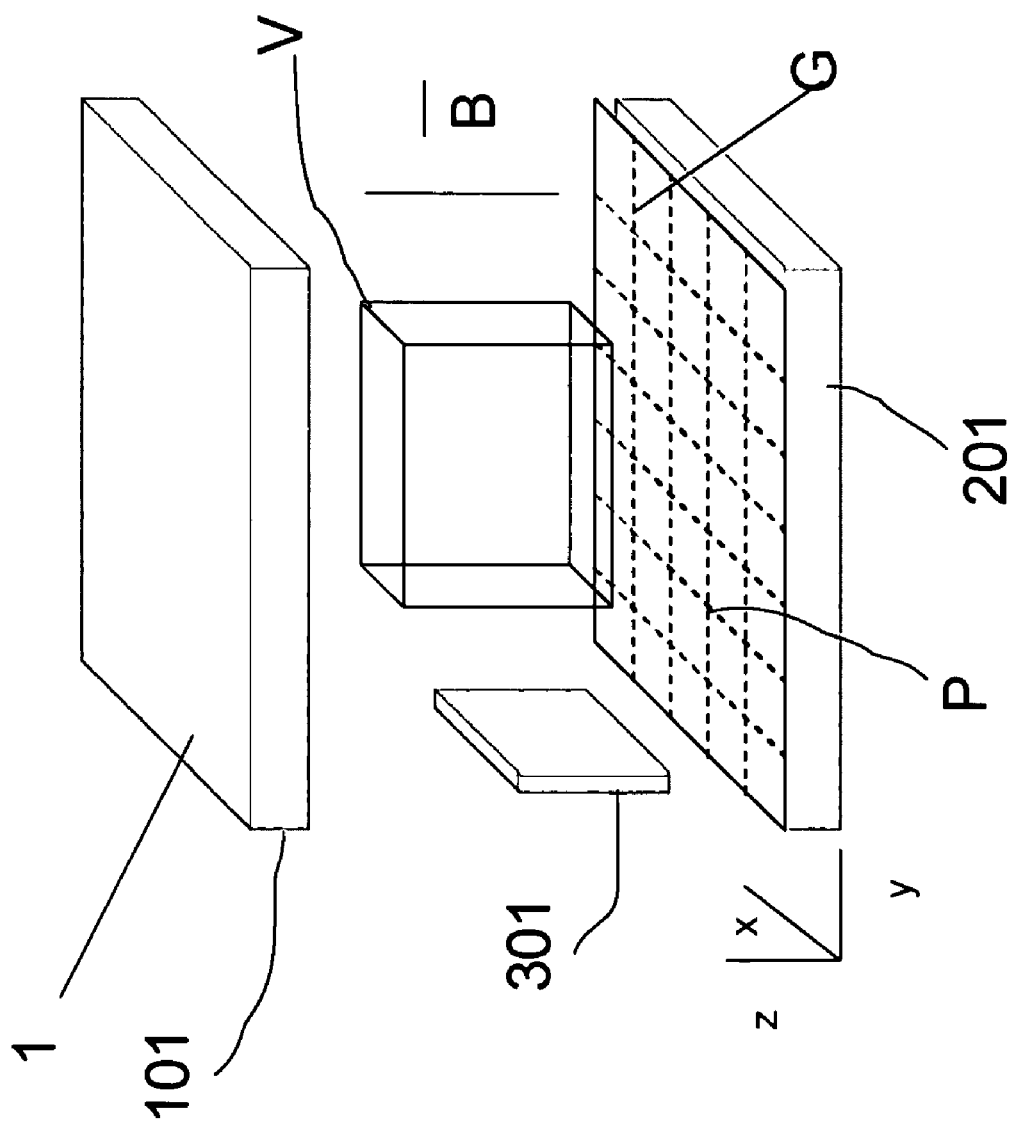

METHOD FOR CORRECTING INHOMOGENEITIES OF THE STATIC MAGNETIC FIELD, PARTICULARLY OF THE STATIC MAGNETIC FIELD GENERATED BY THE MAGNETIC STRUCTURE OF A MACHINE FOR ACQUIRING MRI IMAGE

FIELD OF THE INVENTION

The invention relates to a method for correcting inhomogeneity of the static magnetic field and, more particularly, correcting inhomogeneity of the static magnetic field generated by the magnetic structure of a machine for acquiring nuclear magnetic resonance images.

BACKGROUND OF THE INVENTION

Methods for correcting inhomogeneities of the magnetic field in a spatial volume provided for example in a cavity of a magnetic structure for a nuclear magnetic resonance imaging machine exist that are known and widely used.

Such method is based on the following theory disclosed with reference to a system of cartesian and three-dimensional coordinates.

The magnetic field in a spatial volume for each component has to satisfy Laplace's equation. Thus in three-dimensional space described by cartesian coordinates, components according to diretrixes of coordinate system have to satisfy following Laplace's equations:

$$\nabla^2 Bx = 0; \quad \nabla^2 By = 0; \quad \nabla^2 Bz = 0 \tag{1}$$

where Bx, By and Bz are components of the magnetic field along axes x, y and z of the coordinate system.

Thus it is possible to carry out a series expansion based on a set of orthogonal functions $f_n$ with $n = 1, \ldots, \infty$, which series for each x, y and z components is described by the following equation:

$$B = \sum_{i=0}^{N} a_i f_i = a_0 f_0 + \sum_{i=1}^{N} a_i f_i \tag{2}$$

Apart from zeroth coefficients that are constants, components of the expansion having coefficients from 1 to N order describe inhomogeneities of the magnetic field along the direction of the corresponding coordinate.

Therefore for each component Bx, By and Bz of the magnetic field it is possible to define an inhomogeneity vector $\vec{a}$ whose components are composed of coefficients $a_1, \ldots a_N$ of the series expansion and whose modulus corresponds to the measured inhomogeneity.

If a three-dimensional or two-dimensional grid of positioning points is defined outside the spatial volume wherein the magnetic field is examined and if a magnetic dipole is positioned in a positioning point of said grid, then even the magnetic field of the magnetic dipole has to satisfy Laplace's equation for each components and similarly to what has been made for the magnetic field under examination in the spatial volume it is possible to determine an effect vector of said dipole describing the dipole effect on the magnetic field in the spatial volume that is on one components of the magnetic field, components of said effect vector are composed of 1 to N order coefficients of a series expansion of one of components of the the magnetic field of said dipole based on the same set of orthogonal functions $f_n$.

Therefore for each component of the magnetic field in the spatial volume it is possible to define a corresponding effect vector describing the effect of the corresponding component of the magnetic field of the dipole on the corresponding component of the magnetic field in the spatial volume.

In this case the magnetic field of dipole D in the positioning point p of the grid will be mathematically described for each components according to three directions of axes of the cartesian system defining the equation space $$D_p = \sum_{i=0}^{N} d_i f_i = d_0 f_0 + \sum_{i=1}^{N} d_i f_i \tag{3}$$

the effect vector $\vec{d}_p$ of dipole D in positioning point p will be therefore composed of components $d_{1,p}, \ldots, d_{N,p}$.

Considering that m positioning points on three-dimensional or two-dimensional grid are all taken by a dipole, the effect of this dipole set on magnetic field inhomogeneities in spatial region is defined as the linear combination of effect vectors of all individual dipoles provided on the positioning grid and that is such effect will be provided by the the following linear combination:

$$\sum_{p=1}^{M} c_p \vec{d}_p \tag{4}$$

where $c_p$ are linear combination coefficients. Since said dipoles have to generate a magnetic field whose effects are exactly contrary to magnetic field inhomogeneities in spatial volume, the ideal solution still for each component of the magnetic field along three axes of the coordinate system is given by the equation:

$$\left| \sum_{p=1}^{M} c_p \vec{d}_p + \vec{a} \right| = 0 \tag{5}$$

The solution of this equation leads to determine positions on three-dimensional or two-dimensional grid, the number of dipoles as well as to determine the magnetic moment of each dipoles necessary for compensating inhomogeneities of the magnetic field in said spactial volume obviously with respect to the corresponding component of the magnetic field along one of three axes. Positions are given by index P while coefficient $c_p$ is proportional to magnetic moment value that each dipole having a coefficient different from zero and position p in the grid of positioning points must have in order to achieve the compensation of inhomogeneities of the magnetic field in the volume where it is examined.

In practice said condition is never reached and therefore there is provided to determine the number of dipoles, charge values and specific positions on the grid that minimize the difference of equation (5).

By truncating the series expansions for a certain value of the index N, the number of components of vectors remains a finite one as well as by providing a three-dimensional or two-dimensional grid with a finite number M of positioning point p of correcting dipoles.

Although this method gave considerable results, it has some drawbacks. Particularly the known method does not minimize the number of dipoles and therefore positioning points thereof or the norm of magnetic moment modulus of the compensation dipole set.

There have been made attempts for reducing the computational effort and the number of dipoles and/or the total magnetic moment of the dipole set by introducing a symmetry-based approach that can help in defining repetetive models for positioning point subsets in delimited areas of the positioning grid. However the reduction of the number of dipoles and/or of the total magnetic moment of the set thereof and of the computational effort is not satisfactory.

This is due to the fact the use of the above mentioned method for determining dipoles can lead to combinations of dipoles that are close one with the other having reverse polarity and approximately the same magnetic moment modulus and whose effects partially suppress so that instead of having a solution providing a single dipole with a certain magnetic moment there are provided two dipoles or three dipoles with reverse polarities one with respect to the other and whose effects partially suppress causing a compensating effect that is very similar to the one of a single dipole in a different position.

BRIEF SUMMARY OF THE INVENTION

A method for correcting inhomogeneity of the static magnetic generated by the magnetic structure of a machine for acquiring nuclear magnetic resonance images includes the following steps:

a) defining a surface enclosing a spatial volume permeated by the magnetic field of the magnetic structure;

b) describing said surface by a system of three-dimensional coordinates;

c) measuring a value of components of the magnetic field along at least one direction of said system of three-dimensional coordinates:

d) describing the components of the magnetic field along at least one direction by a series expansion based on an orthogonal set of functions $f_n$ truncated at a predetermined finite maximum order;

e) for at least one component of the magnetic field, defining an inhomogeneity vector whose components comprise coefficients of the series expansion of step (d), said vector describing a trend of the corresponding component of the magnetic field;

f) from the measured value of at least one component of the magnetic field, obtaining numerical values of the components of the inhomogeneity vector;

g) defining a multi-dimensional grid that defines a number of positioning points P, each having a predetermined position with respect to the spatial volume in which the magnetic field inhomogeneity is to be corrected;

h) defining an effect vector $d_p$ that describes an effect of a component of a magnetic field of a dipole $D_0$ positioned in any of the positioning points P on the corresponding component of the magnetic field in the spatial volume, wherein components of the effect vector $d_p$ comprise coefficients of a series expansion that describes said component of the magnetic field generated by said dipole based on a set of orthogonal functions $f_n$ truncated at an order no less than the order of the series describing the magnetic field in the spatial volume;

i) defining a linear combination of the effect vectors of each of said dipoles $D_p$ describing a combined effect on at least one component of the magnetic field in the spatial volume generated by a set of the dipoles each lying in a different position on the grid and each provided with a magnetic moment;

j) determining a number, position and magnetic moment of compensation magnetic dipoles that minimize a norm of a difference between said linear combination of effect vectors of said dipoles and the inhomogeneity vector of the corresponding component of the magnetic field in the spatial volume; and k) positioning said compensation dipoles on the grid in corresponding positions.

According to the method, a function is minimized such that a total magnetic moment of said compensation dipoles for compensating the magnetic field inhomogeneity is minimized and said norm of the difference between the inhomogeneity vector of each component of the magnetic field and the linear combination of effect vectors corresponding to said component of the magnetic field of said compensation dipoles is minimized.

BRIEF DESCRIPTION OF THE DRAWINGS

Characteristics of the invention and advantages will be more clear by the following description of some schematical examples of the method according to the invention disclosed with reference to annexed drawings, wherein:

FIGS. 7 to 15 schematically show modes for the perturbation calculation carried out for each iterative steps of the method according to the present invention considering a variation range of magnetic moment intensity values of half of a unit value of magnetic moment intensity and possible combinations of such variations for a first pair of compensation dipoles that in the iteration step in progress are part of the subset of compensation dipoles to be arranged on the positioning grid.

FIG. 17 is similar to FIG. 2.

FIGS. 18 and 19 show how for an identical modulus of inhomogeneity residual vector it is possible to have different distributions of values of components of said vector that correspond to values of coefficients of the series expansion on orthogonal base of the residual magnetic field or a component thereof.

FIG. 20 schematically shows the structure of FIG. 1 to which a member composed of magnetized material has been added in order to highly change the initial inhomogeneity.

DETAILED DESCRIPTION OF THE INVENTION

Figure 1:
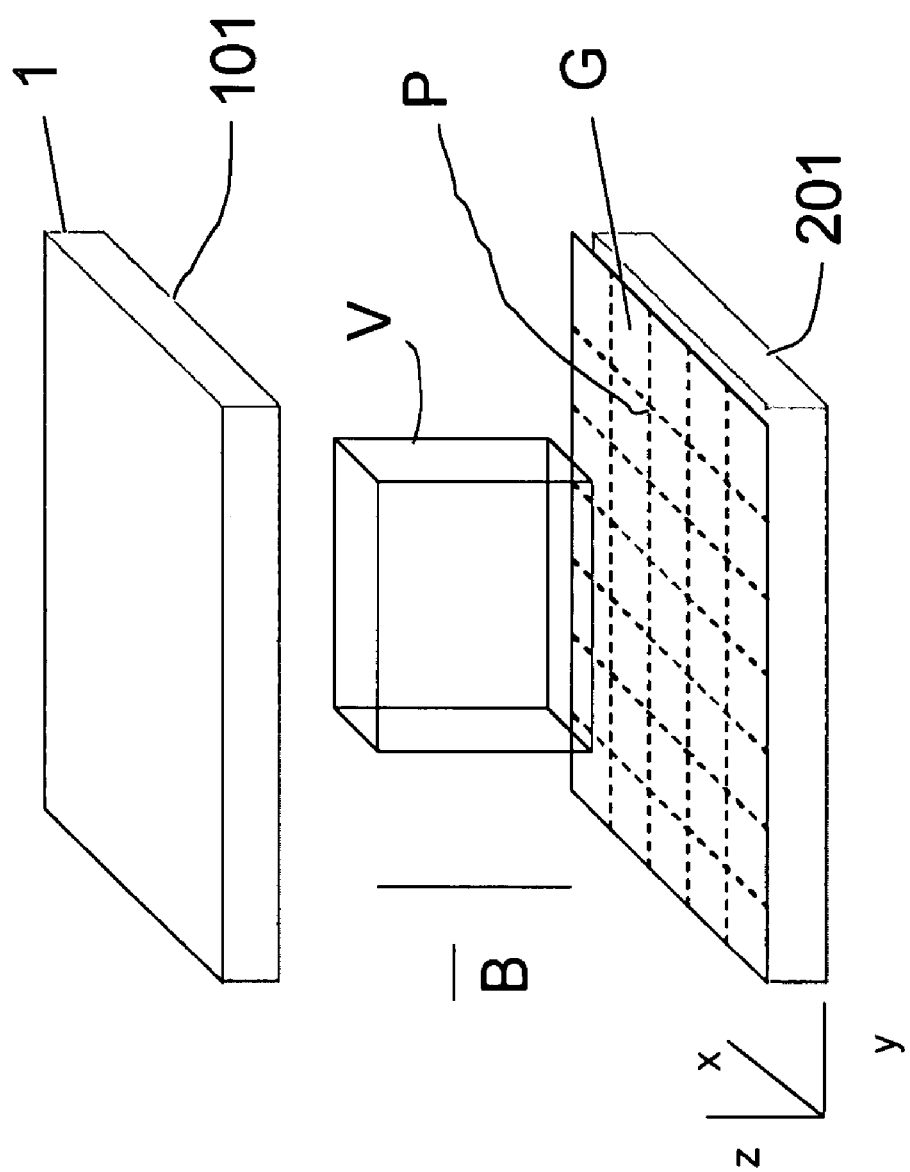
FIG. 1 schematically shows a magnetic structure with a positioning grid for dipoles compensating inhomogeneity of a magnetic field.

The object of the invention is to improve a method for correcting inhomogeneities of the static magnetic field particularly of the static magnetic field generated by the magnetic structure of a machine for acquiring nuclear magnetic resonance images of the type disclosed hereinbefore in order to optimize and namely minimize the number of dipoles required for achieving the compensation of inhomogeneities of the magnetic field and/or to minimize the total magnetic moment due to dipoles compensating inhomogeneities, and at the same time allowing to reduce different discrete values of magnetic moments used for the compensation dipoles, limiting the minimum variation step of magnetic moment to the unit value or to a small number of rational fractions of the unit value of magnetic moment as well as allowing also to achieve a more efficient compensation also regarding a modelling of the inhomogeneity trend of the magnetic field on said surface enclosing the spatial volume permeated by the magnetic field and/or in said spatial volume.

According to a first improvement step the method provides to minimize a function wherein even the total magnetic moment of compensation dipoles provided for compensating the magnetic field inhomogeneity is minimized in addition to minimizing said certain norm of the difference between inhomogeneity vector of each component of the magnetic field and linear combination of effect vectors corresponding to said component of the magnetic field of compensation dipoles.

Particularly said total magnetic moment of compensation dipoles is expressed also as a sum of squares of coefficients of said linear combination suitably individually weighted in a different way, which coefficients are correlated, particularly proportional to magnetic moments of each corresponding compensation dipole.

Particularly the number of dipoles, the magnetic moment value and the position thereof is obtained by the following operation:

$$\min\left(\left\|\sum_{p=1}^{M} c_p \vec{d}_p + \vec{a}\right\| + \sum_{p=1}^{M} \lambda_p c_p^2\right) \quad (6)$$

Coefficients $\lambda_p$ are a priori and empirically set following selection criteria based on effects that such coefficient has on the magnetic moment of each dipole.

According to a first selection criterion, the action of coefficient $\lambda_p$ as amplifier/attenuator of efficacy the that the corresponding dipole at position p exerts on the magnetic field is used. This affects the magnetic moment value determined for said dipole and therefore even the compensation dipole size. Hence, by choosing small values of $\lambda_p$ the minimization of minimizing the expression (6) will lead to give to the corresponding dipole a greater magnetic moment and vice versa. It is also possible to affect to a certain extent the magnetic moment amount to be given to a specific dipole and therefore the size thereof. This can be important when in a magnetic structure the space for housing compensation dipoles varies along the positioning grid extension due to the shape of the magnetic structure.

A further criterion for selecting coefficients $\lambda_p$ is based on the fact that said coefficients can be selected so to reduce the total instability of the solution with which compensation dipoles are determined namely to prevent for a compensating solution to be determined having compensation dipoles arranged at grid positions that are very close one with respect to the other and which dipoles have magnetic moments opposite in sign and with similar value or intensity.

Even in this case, the definition of values of coefficients $\lambda_p$ is empirically carried out by test and trials or by heuristic means or in experimental way, however there being always necessary for the dipole set, magnetic moments thereof and coefficients $\lambda_p$ to satisfy minimizing conditions of the above expression (6).

With reference to the requisite of expression (6) it is to be noted that generally in practical terms it is not interested to define the combination of dipoles with corresponding positions on the positioning grid and corresponding magnetic moments that satisfy the expression by representing the solution corresponding to the absolute minimum of expression (6). In practice, the compensation of inhomogeneities must not be a complete one, but is sufficient for the variation of magnetic field intensity in spatial volume considered considerable to remain under a predetermined maximum threshold. For example in the case of MRI machines, tolerances related to magnetic field inside the imaging volume, that is a volume wherein the anatomical district to be investigated is positioned, are generally of some units to some dozens of ppm (parts per million) peak to peak. Thus considering the problem in practical terms and so the solution of expression (6) from a numerical point of view, it is sufficient for the combination of compensation dipoles to satisfy the modified expression (6) and that is:

$$\left(\left\|\sum_{p=1}^{M} c_p \vec{d}_p + \vec{a}\right\| + \sum_{p=1}^{M} \lambda_p c_p^2\right) \le \text{threshold} \qquad (6')$$

where the threshold value is just an acceptability value provided for the application the magnetic structure is intended for and correlated to typical tolerance in MRI machines.

From an analytical point of view, the modified expression (6) has not a single solution, but it determines a space of solutions all satisfying said equation. Thus it is possible to choose among solutions included within the space of solutions searching for a compromise solution optimizing not only the compensation of inhomogenities of the magnetic field, but also solving further practical problems that occur for example when carrying out the compensation of the magnetic field and especially during the merely practical step for realizing compensation dipoles and positioning thereof on the positioning grid associated to the magnetic structure.

Steps of the compensating method above defined are substantially mathematical or numerical steps and do not consider that in practical terms errors due to tolerances can easily affect the carrying out of the method. Particularly measurements of the magnetic field are already affected by tolerances along at least the surface delimiting the spatial volume wherein an homogeneous magnetic field is desired or in said spatial volume. Moreover, both magnetic moment value of the dipole that actually will be positioned within the positioning grid and also said position are subjected to errors or tolerances. Generally said errors or said tolerances sum one with the other in a not-destructive manner, so a solution analytically, numerically and theoretically satisfying the inequality (6) providing a minimum value thereof below the maximum acceptability threshold, when it is used, that is when dipoles with the corresponding magnetic moment value are manufactured and when said dipoles are positioned on the grid it can lead to a solution that in practice is not acceptable, the residual inhomogeneity of the magnetic field being not below the provided maximum threshold.

Therefore considering the above mentioned problem, the invention provides an improvement wherein dipoles compensating magnetic field inhomogeneities are determined for each component of the magnetic field by means of the following combination of steps:

a) by computing the expression (6) determining the combination of compensation dipoles, positions thereof on the positioning grid and the magnetic moment value of said dipoles that consitutes a solution of said minimizing expression (6);

b) selecting a subset of said compensation dipoles composed of a certain number of dipoles that is smaller than the total number determined at step a);

c) positioning said dipoles of said subset in corresponding predetermined positions of the positioning grid giving magnetic moments determined at step a) to said dipoles;

d) carrying out a measurement of the magnetic field along at least the surface enclosing the spatial volume or in said spatial volume wherein the magnetic field is to be compensated with respect to possible inhomogenities or e) repeating the computing step of point a)

f) determining a new subset of compensation dipoles at least a part of them being different as regards position and/or magnetic moment than those of the subset of compensation dipoles previously determined and already positioned on the positioning grid at step c);

g) positioning said dipoles of the new subset in the corresponding predetermined positions of the positioning grid giving corresponding magnetic moments resulting from the computation to said dipoles;

h) repeating steps d) to g) till all compensation dipoles resulting from the computation of the minimizing expression (6) are positioned on the positioning grid.

According to an improvement there are two modes for carrying out the above mentioned steps with respect to the processing in the second and subsequent iteration steps of dipoles that have been already positioned in previous iteration steps.

A first variant provides that when computing the minimizing expression (6) for a subsequent iteration step, values relevant to compensation dipoles already positioned in previous iteration step or steps are not more considered, considering the effect thereof by measuring the magnetic field for determining a new inhomogeneity vector.

An alternative variant on the contrary provides that, apart from the fact that in previous iteration step or steps some compensation dipoles included in subsets of compensation dipoles defined for each previous iteration step have been positioned on the positioning grid, when computing the minimizing expression (6) even said compensation dipoles already previously positioned on the positioning grid are reconsidered as variables to be determined, so that such computation can lead to a solution providing at least one or more compensation dipoles that are in a position that coincides with one or more compensation dipoles determined and positioned on the positioning grid in the previous iteration step or steps. In this case, to compensation dipoles already previously positioned in previous iteration step or steps there is added the magnetic moment value computed in the subsequent or in each subsequent iteration steps for compensation dipoles determined in said subsequent iteration step or steps and coinciding with said dipoles already positioned on the positioning grid in previous iteration step or steps.

Both alternatives can be provided as alternatives that are automatically choosen depending if one does not provide an acceptable solution according to requisite of the modified expression 6 and that is leading to a not satisfying or acceptable compensation with respect to the maximum variation threshold of the magnetic field intensity provided for the application the magnetic structure is intended for.

Particularly, in a compensating method wherein firstly the first variant considering compensation dipoles already positioned at previous iteration step constant and not more changeable is choosen and if such step does not generate an acceptable compensating solution, that is within limits of the maximum variation threshold of the magnetic field for the magnetic field component under examination, than the method provides the repetition of the iteration step wherein the second said variant is automatically carried out and namely wherein even compensation dipoles that in previous iteration step or steps have been positioned on the positioning grid are again considered as variables.

By carrying out in this way the iterative process, possible tolerances related to the positioning and attribution of the magnetic moment to compensation dipoles are progressively compensated, which tolerances can be introduced when practically manufacturing and positioning compensation dipoles and when practically attributing the magnetic moment value thereof, with respect to nominal numerical values of magnetic moment and position defined by the minimizing computation.

At each operative step, hence by measuring again the magnetic field at least along the surface enclosing the spatial volume or in said spatial volume after having positioned only a restricted number of compensation dipoles, it is possible to limit deviations introduced by errors due to adverse sums of tolerances. These are hence automatically measured and so considered and therefore can be at least partially recovered in the subsequent iterative step of the method, there can be possible to carry out the compensation of said deviations only by means of additional dipoles not yet positioned on the positioning grid and an of adjustment particularly of magnetic moment value of compensation dipoles that have been positioned on the positioning grid in previous iterative step or steps.

By means of the method according to the invention improvements disclosed up to now allow to effectively limit drawbacks, such as a total magnetic moment of compensation dipoles very high, the use of bad combinations of compensation dipoles providing dipoles with reverse polarity magnetic moment and with a similar intensity in a position near one with respect to the other, the achievement of unsatisfactory and not acceptable compensation due to tolerances and errors for attributing magnetic moment to compensation dipoles to be positioned on the positioning grid and for positioning thereof on said grid which are exactly introduced during the practical steps for carrying out the compensation.

However the above mentioned method can be further improved by means of its iterative structure and of comments made with regard to numerical/pratical point of view of the compensation, according to which the absolute minimum of expression (6) is not usually considerable for the necessary practical compensating effect. Particularly the method disclosed above can be further improved such that it is possible to achieve a compensation dipole set that not only optmizes the compensation in the sense of reducing variations of magnetic field along components thereof below a predetermined maximum variation threshold of said magnetic field, but at the same time allows to limit possible intensity values of magnetic moment that can be given to compensation dipoles when computing the minimizing equation to a discrete set of said values according to a discrete scale of values that can be taken by magnetic moment of dipoles and which discretization steps are constant and can be defined by the user and moreover it allows even to select dipoles of the compensation dipole combination satisfying the minimizing equation always below a value defined by said maximum acceptable variation threshold of the magnetic field in the spatial volume, so that the trend of the compensated magnetic field has the best peak to peak amplitude, that is in this case the smallest peak to peak oscillation/amplitude.

The first consideration, that is the restriction within a discrete scale of values of values of magnetic moment intensity that can be given to compensation dipoles leads to a considerable advantage as regards time for manufacturing compensation dipoles and as regards costs of said compensation dipoles. Such compensation dipoles are generally composed of small elements permanently magnetized that are positioned and secured on the positioning grid provided in the magnetic structure or associated thereto. So by providing a discretization scale for magnetic moment values with variation steps equal to unit value of the magnetic moment intensity or equal to a half of the unit value of the magnetic moment intensity it is necessary to have available a smaller number of different elements permanently magnetized with the corresponding magnetic moment intensity values with which a magnetic dipole having a predetermined magnetic moment intensity can be manufactured by combining said elements. For example it is possible to provide magnetized elements with unit value of magnetic moment intensity, magnetized elements with value corresponding to 5 and 10 times the unit value and magnetized elements with magnetic moment intensity value equal to an half of the unit value.

The second consideration involves considerable advantages as regards the elimination of local inhomogenities of the magnetic field whose inhomogenity has to be compensated and for example in MRI applications it may lead to local aberrations on the acquired image that can be also interpreted as artefacts or causing image areas not to be diagnostically interpreted.

Considering that practical criteria defining the solution regarding the definition of the combination or set of dipoles compensating inhomogenity allow to have a space of solutions comprising a certain number of different solutions which are alternative one with respect to the other satisfying the expression (6) and particularly according to the modified one (6'), the invention provides an improvement of the method consiting in identifying in said solution space, the solution defining the set of compensation dipoles satisfying even one or both conditions above mentioned and which regarde the fact of limiting the intensity value of the magnetic moment of compensation dipoles to discrete values according to a discrete variation scale of said values and the trend of the compensated field with a peak to peak oscillation/amplitude as small as possible or within a predetermined tolerance.

Therefore within acceptable solutions, the invention provides to determine the solution providing the compensation dipole combination whose magnetic moments differ only according to discrete steps, preferably minimum steps of a magnetic moment unit or one or more fractions of the unit value of magnetic moment intensity.

In addition to or alternatively within acceptable solutions, that is the space of solutions, the invention provides to determine the solutions whose compensation dipole combination provides to generate a magnetic field having field local variations very small, that is having a small peak to peak oscillation/amplitude.

It is to be noted how said further criteria or steps of the compensating method are independent one with respect to the other and can be applied according to any sequence order depending on needs to be considered as priority ones when compensating the magnetic field.

While the reduction of different sizes of structural elements of dipoles as regards the magnetic moment of said elements is a quite clear concept, as regards the choice of dipole combination having a compensating effect with the smallest peak to peak ratio it is explained in the following:

If it is considered that each dipole with a predetermined magnetic moment intensity value exerts an effect on the magnetic field whose trend is rappresented by curves or oscillations of the magnetic field, the compensation of inhomogenities geometrically consists in flattening as more as possible the trend curve of the field along the direction of the corresponding component. Considering that the expression does not provide an exact solution, but that the magnetic moment, the number of dipoles and the position are determined by means of an inequality it exists a set of solutions satisfying the criterion of expression (6'). Such set of solutions is also defined by the maximum acceptability threshold for the minimum value according to the inequality (6'). If an acceptability threshold is set, the expression (6) turns into an inequality leading to a set of solutions acceptable according to the expression (6'). Considering also that generally the solution effectiveness is defined by said acceptability threshold or by a maximum tolerance of acceptable residual inhomogeneity that is by a maximum variation of the field along said component of the magnetic field under examination it is clear that it does not exists a single solution but a set of solutions satisfying said requirements.

It has been further found that the use of iterative steps for determining compensation dipoles allows to select the compensation dipole combination providing a solution with the best peak to peak oscillation/amplitude or the compensated field within the size of the spatial volume or for an area of interest and referring to each component of the magnetic field with acceptable computation time and costs. Referring to the present application the best peak to peak oscillation/amplitude means the value as small as possible of the difference of the compensated magnetic field between any two points inside the spatial volume or area of interest.

Figure 5:
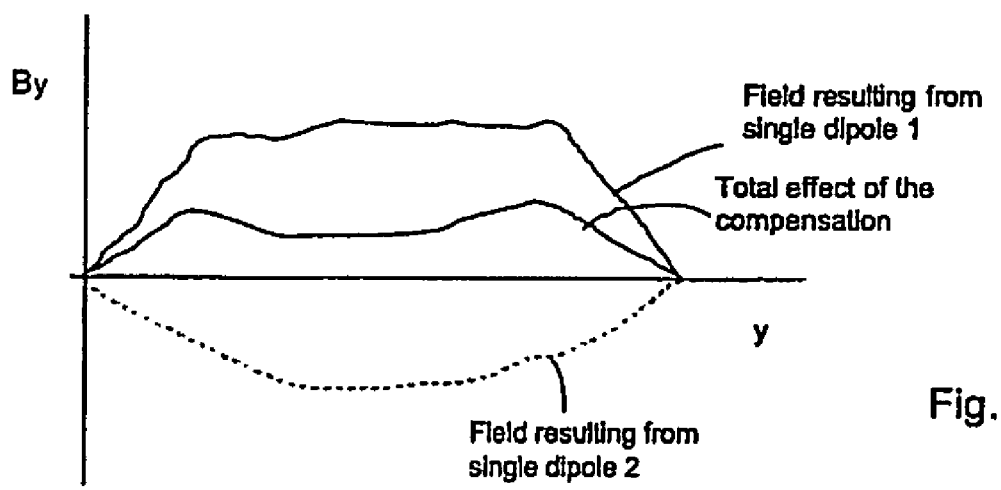
FIGS. 5 and 6 show in a simplified way two solutions being part of the space of acceptable solutions and obtained by a first embodiment of the method according to the present invention and which solutions have different peak to peak oscillation/amplitude still satisfying mathematical/numerical requirements for determining the compensating solution.
Figure 6:
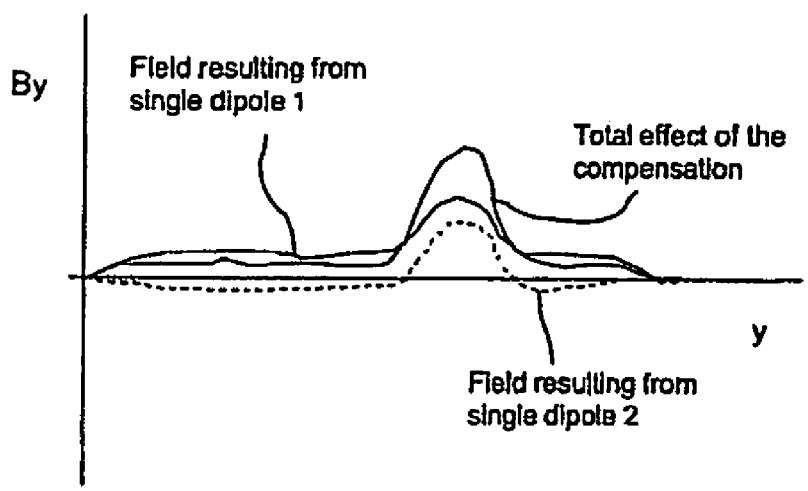

FIGS. 5 and 6 approximately explain the peak to peak oscillation/amplitude concept used herein and show two possible acceptable solutions, that is both hypothetically satisfying the criterion of the inequality expression (6') and therefore are part of the space of acceptable solutions, in an hypothetical example wherein compensation of inhomogeneities can be reached only by means of two compensation dipoles. The hypothetical example refers to the compensating effect reached by the combination of said two compensation dipoles having different magnetic moments C1 and C2 and positions P1 and P2 on a positioning grid. In the first solution the two dipoles influence to a very limited extent on the field trend along the component under examination. In the second solution the effect on the field of each compensation dipole is a greater one if considered with reference to individual dipoles. However the second solution has a final trend satisfying the minimizing criterion of the inequality expression (6') but having a considerable peak, while in the first solution the total effect on the magnetic field of both compensation dipoles generates a field with a trend that is much more flat, that is the peak to peak oscillation of the magnetic field trend is smaller.

In order to compensate the magnetic field inhomogenity the second solution is considered as the best one between both solutions since it does not provide localized inhomogeneities that can create local aberrations in the image and/or require the presence of further dipoles in other points of the positioning grid.

The method according to the invention advantageously uses the variant iteratively carrying out the compensation of the magnetic field in order to search, alternatively or in combination, in the space of acceptable solutions, the set of compensation dipoles having magnetic moment intensity values according to discrete scale of intensity values of said magnetic moment that is set in advance by the user and the compensation dipole set providing a trend of the compensated magnetic field with the smallest peak to peak oscillation/amplitude or anyway below a predetermined maximum threshold also defined in advance by the user.

Particularly said search in the acceptable solution space, alternatively or in combination, of said set of compensation dipoles having magnetic moment intensity values according to the discrete scale of intensity values of said magnetic moment that is set in advance by the user and of the compensation dipole set providing a trend of the compensated magnetic field with a smaller peak to peak oscillation/amplitude or peak to peak oscillation/amplitude below a predetermined maximum threshold, also defined in advance by the user, is carried out for each iteration step and within said iteration step each time only for the subset of compensation dipoles that have been selected for said iteration step and intended to be actually positioned on the positioning grid before carrying out the subsequent iteration step.

This variant embodiment of the compensating method allows to carry out the search in the space of acceptable solutions, alternatively or in combination, of the set of compensation dipoles having magnetic moment intensity values according to the discrete scale of intensity values of said magnetic moment that is set in advance by the user and of the compensation dipole set providing a trend of the compensated magnetic field with a smaller peak to peak oscillation/amplitude or below a predetermined maximum threshold, also defined in advance by the user, each time for a restricted number of compensation dipoles and namely for compensation dipoles of the subset defined by each iteration step and it combines the advantage of compensating errors due to tolerances with advantages regarding the discretization of magnetic moment intensity values of compensation dipoles and with advantages of the solution having the best or an acceptable peak to peak oscillation/amplitude.

As regards the actual carrying out of the above improvements, the method according to the present invention provides therefore the following further steps:

a) for at least one or for at least some or for all iteration steps and for each compensation dipole of the compensation dipole subset choosen in said iteration step there is applied a perturbation calculation for magnetic moment intensity value determined in said iteration step with respect to values determined by the minimization of expression (6), which perturbation consists in modifying magnetic moment intensity value of each compensation dipole of said subset to such extent to increase and/or decrease magnetic moment intensity value of each said compensation dipoles of said subset leading it to a upper and/or smaller value coinciding with a magnetic moment intensity value provided in the predetermined discrete scale of magnetic moment intensity values and for each combination of variations of magnetic moment intensity value of dipoles of the compensation dipole subset being calculated the value taken by expression (6') depending on said perturbation of magnetic moment intensity values of dipoles of said subset and said value being compared with the threshold value related to or proportional to the maximum acceptable variation value of the corresponding component of the magnetic field;

b) finally as compensation dipoles of the subset with modified or pertubed magnetic moment intensity values being selected those dipoles included in said compensation dipoles of the subset having modified or pertubed magnetic moment value which satisfy the inequality (6') and particularly which provide the best solution for the expression (6) that is the one with the smallest value.

According to a further characteristic, in order to provide the perturbation of magnetic moment intensity value of each compensation dipole of the subset selected in the corresponding iteration step of the method compensating inhomogeneities as mentioned above, a range for the possible variation of the magnetic moment intensity value of compensation dipoles of the subset is selected one limit of which corresponds to a magnetic moment intensity value defined by the discrete scale of magnetic moment intensity values which value is greater than or equal to the computed magnetic moment intensity value of compensation dipoles and the second limit corresponds to a magnetic moment intensity value defined by the discrete scale of magnetic moment intensity values which value is smaller than or equal to computed magnetic moment intensity value of compensation dipoles, a distance equal to one or more discrete variation steps of magnetic moment intensity value according to the predetermined discrete scale of magnetic moment intensity.

For example, if the computation provides a value like 7,3 for a compensation dipole of a dipole subset selected in the corresponding iteration step of the method and if the discretized scale of intensity values provides discrete variation steps of magnetic moment intensity value like 0,5, that is a half of a unit value, so it is possible to select as variation range the range from 7 to 8 and to calculate the value taken by function (6) for values 7, 7,5 and 8. Obviously it is also possible to select a variation range of magnetic moment intensity value for the corresponding dipole that is from 6,5 to 8,5 and in this case to calculate the value for the equation (6) for the following magnetic moment intensity values namely 6,5, 7, 7,5, 8, 8,5,. That is carried out for each dipole of the subset and the calculation of value of expression (6) is carried out for any possible combinations of modified magnetic moment intensity values of each compensation dipoles of the subset defined for the corresponding iteration step of the compensating method, as the best solution being considered the combination of compensation dipoles of said subset having magnetic moment intensity values modified with respect to those computed during the minimizing computation that if are inserted in expression (6) provide the smallest value of said expression.

Alternatively to variation steps corresponding to a factor 0,5 of the unit value it is advantageous to provide variation steps corresponding to a unit value. This allows to avoid magnetized members having values equal to a half of a unit value, but only magnetized members having unit value or multiples of this unit value. FIGS. 7 and to 15 graphically show various variation combinations of magnetic moment values of dipoles according to a semplified embodiment.

Therefore said method specifically provides the following steps:

a) by computing expression (6) determining the combination of compensation dipoles, positions thereof on the positioning grid and magnetic moment value of said dipoles which is a solution of said expression (6);

b) selecting a subset of said compensation dipoles that is composed of a certain number of dipoles smaller or equal to the total number determined at step a);

c) defining a discrete scale of magnetic moment intensity values for the compensation dipoles of the subset defined at step b), which scale has discrete variation steps of magnetic moment intensity according to a predetermined scale of discrete variation steps of the magnetic moment that for example is a linear, quadratic, exponential, logarithmic one or any other scale;

d) based on said discrete scale of magnetic moment intensity values defining a variation range $\delta c_p$ of magnetic moment intensity value for each compensation dipole of said subset, such range being delimited by a magnetic moment intensity value greater or equal to and a magnetic moment intensity value smaller or equal to the value computed for each compensation dipole of said subset;

e) generating one after the other or at the same time all possible combinations of compensation dipoles of said subset having magnetic moment intensity value modified to discrete values included in the defined variation range;

f) for each of said different combinations of compensation dipoles generated at step e) carrying out the minimization of expression (6) with respect to variables composed of the value of remaining compensation dipoles of compensation dipole set computed at step a);

g) as the best solution for the combination of compensation dipoles having the modified magnetic moment intensity value generated at step e) and being part of said subset defining the compensation dipole combination with modified magnetic moment intensity value that provides the minimum value of expression (6) according to what disclosed at step f);

h) positioning said compensation dipoles of said subset defined at step g) in corresponding predetermined positions of the positioning grid giving modified magnetic moment intensity values to said dipoles;

i) carrying out a measurement of the magnetic field along a surface enclosing spatial volume wherein the magnetic field has to be compensated as regards possible inhomogeneities;

j) repeating computation step of step a).

k) determining a new subset of compensation dipoles at least part of which being different as regards position and/or magnetic moment than those of the subset of compensation dipoles previously determined and already positioned on the positioning grid at step h);

l) repeating steps c) to k) for the new subset defined at step k) till all compensation dipoles resulting from the computation of expression (6) are positioned on the positioning grid.

According to a particular variant embodiment, the discrete scale of magnetic moment intensity values for compensation dipoles of the subset defined at step b), may be also defined in such a manner to have discrete variation steps of magnetic moment intensity that are identical one with respect to the other and equal to a unit value of magnetic moment intensity or to a fraction of said unit value or to a multiple of said unit value.

As it results from the list of steps disclosed above, it is possible in case for each iteration step of the method to vary the discrete scale of magnetic moment intensity values of compensation dipoles of the subset as regards the iteration step in progress and/or the variation range of magnetic moment intensity values of said compensation dipoles, as well as in case discrete variation steps of said magnetic moment intensity values that for each iteration step are then defined even in a specific and different way than other iteration steps.

In case as regards an iteration step it is also possible to define variation ranges of the magnetic moment intensity value and/or also discrete variation steps of the magnetic moment intensity value that are different for each or for subgroups of compensation dipoles of the subset as regards the iteration step in progress.

In the above method the best solution for compensating the magnetic field is the choice among different combinations of compensation dipoles of the subset relevant to the iteration step in progress whose magnetic moment intensity values have been varied within a predetermined variation range and correspondingly to discrete values of magnetic moment intensity, of the combination of compensation dipoles belonging to the subset relevant to the iteration step in progress having magnetic moment intensity values modified according to above criteria, which combination of compensation dipoles provides the minimum value of the expression (6), according to what disclosed at step f). However it is possible to introduce a further selection criterion consisting in selecting among different combinations of compensation dipoles having magnetic moment intensity values modified according to above criteria for varying said magnetic moments defined above, the combination of said dipoles with modified magnetic moment intensity values providing a trend of the compensated magnetic field with the smallest peak to peak oscillation/amplitude, that is a trend of the magnetic field that is more "smooth" (that is flattened or monotonic) and verifying the inequality (6').

Therefore for each combination of all possible combinations of compensation dipoles of the compensation dipole subset defined for a certain iteration step and having magnetic moment intensity value modified to discrete values included in the defined variation range, the value of expression (6) obtained with said combination of compensation dipoles is computed and the function describing the trend of the compensated field and the peak to peak oscillation/amplitude of said function are calculated, while the combination of compensation dipoles of the subset that have the modified magnetic moment intensity value satisfying the inequality expression (6') and providing a compensated magnetic field with the smallest peak to peak oscillation/amplitude and/or providing the smallest value for the minimizing expression (6) is selected as the best solution.

As previously disclosed, in this case it is suitable to define a maximum threshold for the value that can be taken by the expression (6) in order to consider as an acceptable solution, a solution included among possible combinations of compensation dipoles of the subset defined in the iteration step in progress, which compensation dipoles have magnetic moment intensity values that are modified with respect to values determined by computing the minimum of expression (6), said threshold value being related to or proportional to a maximum inhomogeneity tolerance of the magnetic field, that is to a maximum variation tolerance of the magnetic field.

Therefore it is possible that a certain number of possible combinations of compensation dipoles with modifed magnetic moment intensity values are excluded a priori to a different extent from the number of combinations for which it is necessary to carry out the further calculation of the function describing the trend of the magnetic field and the peak to peak oscillation/amplitude of said function thus achieving a reduction of computational effort above all as regards the time.

Obviously, it is possible also to limit the criterium for selecting the best solution with respect to the combination of compensation dipoles of the subset defined in the iteration step in progress which dipoles have modified magnetic moment intensity values to the fact of only defining such best solution as the one providing a trend of the compensated field with the smallest peak to peak oscillation/amplitude, that is to the combination of compensation dipoles of the subset defined in the iteration step in progress which dipoles have modified magnetic moment intensity values providing a compensated magnetic field more "smooth" (that is more monotonic or flattened).

This firstly depends on requirements for the application of the magnetic field that can change depending on the type of use. However, generally and specifically in MRI imaging sector the criterion minimizing the expression (6) is predominant and in case the criterion of the smallest peak to peak oscillation/amplitude of the trend of the compensated magnetic field is provided in combination with the first criterion as a further improvement thereof.

From what said above it is evident that disclosed improvements allow to achieve a compensation of inhomogeneities below maximum threshold values provided therefor, as well as to limit the total value of magnetic moment of compensation dipoles and at the same time to limit possible magnetic moment intensity values to discrete values according to a predetermined discrete value scale defined as desired by the user and still at the same time to achieve a compensated magnetic field as smooth as possible, that is with the smallest peak to peak oscillation/amplitude.

The iterative mode for determining compensation dipoles and for actually compensating inhomogeneities of the magnetic field allows to compensate tolerances in constructing and positioning compensation dipoles in practical steps of the method providing the construction of compensation dipoles and the positioning thereof on the grid. Such tolerances lead to deviations of the effect exerted by compensation dipoles positioned on the grid than those defined in numerical steps for determining necessary compensation dipoles and magnetic moment intensity values thereof.

Still in combination with the above advantages, the method according to the invention allows to influence the amount of magnetic moment to be given to various compensation dipoles and their polarity allowing also to avoid compensation arrangements wherein compensation dipoles with positions that are close or directly adjacent one with respect to the other have reverse polarities and similar magnetic moment intensities, so the effect of said two adjacent dipoles partially annull.

As regards the criterion for achieving a compensated magnetic field with a trend more "smooth", the importance of such criterion is anyhow intuitive for the person skilled in the art since the solution satisfying even the requirement of having a better peak to peak oscillation/amplitude is the one that even locally approaches most the ideal result wherein the field trend is composed of a substantially flat curve, referring to the component under examination, namely the field component is as costant as possible for all the extension of volume in the direction of said component.

It is important to underline that method steps described above refer always to the execution of the method for at least one component of the magnetic field permeating the spatial volume wherein inhomogeneities have to be compensated. It is possible to extend the process even to other components when this is necessary depending on the application the magnetic field is intended for. Generally for magnetic field used in MRI sector a single component of the magnetic field is considered. When it is desired to apply the process even to other components of the magnetic field it is possible to carry out above steps for each of said further components of the magnetic field and the above method is applied in exactly the same way for any of said components of the magnetic field.

Further details and further features will be clear from the following description of some examples.

It is to be noted that if the general case of a generic volume is considere wherein an homogeneous magnetic field has to be achieved for each of its components in combination with a generic position grid, then the computation of compensation dipoles is heavy regarding calulation steps.

Fortunately particularly in nuclear magnetic resonance machines means for generating the magnetic field provided in magnetic structures thereof have often a construction leading to symmetries with respect to an axis. This reduces the computational effort as already known in shimming processes. In this case the positioning grid may be composed of a two-dimensional plane formed with concentric rings and radial lines. Once the number of dipoles, their magnetic moments and their positions for each quadrant have been determined, the definition of the number of dipoles, charges and positions is therefore arranged by symmetry reasons for the remaining quadrants.

However a direct application of very localized magnetic moments in such grid from a macroscopic point of view can lead to the achievement of above compensating conditions, while from a detained point of view, very localized magnetic moments can lead to a distribution producing field vortices that in turn generate aberrations in images and/or can also break occurring symmetries.

In order to satisfy the requirement of respecting symmetry conditions inherent in the magnetic field structure and determined by the construction and arrangement of means generating the magnetic field, when there is an axial symmetry, the invention provides to distribute the charge determined for each individual radius on all the circumference of a ring having said radius.

In substance, the single position variable is given by the radius and not by the angular position of the charge since the latter is uniformly distributed along all the circumference having said radius.

The grid of positioning points in this case is limited to a grid made of concentric circles or rings having a predetermined radius, it being possible to define discrete radial positions and charge rings being able to take only radial magnitudes among the available discrete ones.

Such further improvement related to the specific application to magnetic fields and to means generating magnetic fields with an axial-symmetric configuration changes the above method steps to such an extent to reduce computational effort, the re-formulation of mathematics expressed for the general condition into the form suitable for this specific application being obvious for the person skilled in the art.

There are many advantages. Firstly there is a considerable semplification of the grid. This leads to a greater easiness and rapidity in carrying out the compensation, that is in actually positioning compensation dipoles in the magnetic structure. In fact the only magnitude that is considerable or to be observed is the radial arrangement that is made real by arranging magnetized members making ring sectors with predetermined radius along positioning paths indicated by circular lines. Regarding the correct positioning of rings or of positioning circular paths, the latters having a radius defined by the minimizing computation of expression (6) have only to be exactly centered with respect to the axis of the volume under examination.

The annular arrangement allows for each compensating ring to have only one type of compensation dipole regarding both the magnetic moment intensity value and sizes, the total magnetic moment intensity value for a specific positioning radius being distributed on the corresponding circumference having a length also defined only by the positioning ring, and magnetic moment value being directly proportional to said sizes.

Moreover distributions of magnetic moments introducing a break of the symmetry on the same circumference cannot obviously be introduced. This improvement is advantageous even regarding positioning errors or positioning tolerances with respect to the arrangement of individual compensation dipoles with localized sizes even in circumferencial or angular direction. This is immediately intuitive for the person skilled in the art. The arrangement of dipoles with the same magnetic moments and forming an annular arrangement of compensating magnetic moments prevent more easily the possibility of errors due both to tolerances of the magnetic moment value and to positioning errors with respect to the solution providing the arrangement of compensation dipoles localized on a predetermined circunference and in a predetermined relative angular position. While in the present case the angular arrangement is not important, in the case of the arrangement of compensation dipoles localized on the same circumference and with different relative angular positions, the angular arrangement is a positioning variable that can be slightly different regarding tolerances or however it can be made wrong by the technician that physically arranges compensation dipoles on the positioning grid.

The advantage in arranging magnetic moments on annular members is that angular positioning errors are automatically absorbed since the mean of the magnetic moment on the circumference is important for axial coefficients.

The process for compensating inhomogeneities of the magnetic field considered up to now according to the present invention determines compensation dipoles by means of an approach consisting in minimizing the norm of the difference between an inhomogeneity vector whose components are composed of coefficients of the description of the magnetic field with a series expansion on a base of orthogonal functions and a compensation dipole effect vector whose components are composed of the description of the magnetic field generated by compensation dipoles by means of a series expansion on a base of orthogonal functions. This is expressed by expression (6).

It is possible to face the problem of defining the compensation by using an alternative approach. This alternative approach provides to find a solution minimizing the square of the sum of magnetic moments.

Considering a more precise formally point of view, by defining as an inhomogeneity residual vector of the compensated magnetic field the vector $\vec{\rho}$ according to the following expression:

$$\sum_{p=1}^{M} c_p \vec{d}_p + \vec{a} = \vec{\rho}$$

said inhomogeneity residual vector $\vec{\rho}$ similarly to inhomogeneity vector has components $\rho_1, \ldots \rho_n$ that are composed of coefficients of the series expansion based on the same orthogonal functions $f_n$ of the compensated magnetic field disclosed hereinbefore, the space of acceptable compensating solutions can be defined by a threshold $S_1, \ldots S_n$ for each value of the component $\rho_1, \ldots \rho_n$.

The criterion of the first approach and criteria of the present second approach differs in that the criterion for determining the compensation of the first approach, by the inequality (6') in a certain sense defines a sphere wherein the residual vector has to remain as regards its length, while criteria of the second alternative approach consider thresholds separated for each components of the residual vector, namely they define an ellipsoid wherein the residual vector has to remain as regards its length. Moreover the second approach coincides with the first one, if as the combination of dipoles and corresponding magnetic moments the one that satisfies the criterion according to which each components $\rho_1, \ldots \rho_n$ of the residual vector $\vec{\rho}$ has a value below the corresponding threshold $S_1, \ldots S_n$, and characterized in that $S_1 = S_2 = \ldots S_n$ is selected. Among possible solutions corresponding to different combinations of compensation dipoles and respective magnetic moments satisfying both the above criteria, there is selected the one providing the minimum value for the square of the sum of magnetic moments of compensation dipoles.

The first criterion of this second alternative approach that consists in the fact that for each component $\rho_1, \ldots \rho_n$ of the residual vector $\vec{\rho}$ a maximum threshold value $S_1, \ldots S_n$ is defined below which the value of component $\rho_1, \ldots \rho_n$ has to remain, is mathematically a constraint. This constraint is a generalization of the inequality expression (6') and also in this case it defines a level of acceptability of the compensating solution.

In addition to or instead of what said above, it is possible to define an additional constraint consisting in maintaining the sum of squares of magnetic moments of compensation dipoles below a maximum threshold.

In these cases, from a mathematical point of view it is possible for the problem not to have a solution, so the use of the second approach cannot always be guaranteed or applied.

However considering the possibility to define maximum thresholds for values of components $\rho_1, \ldots \rho_n$ of the residual vector, the second approach has per se some advantages. In fact the possibility of imposing limits to values of components of the residual vector is the same as modelling the compensated magnetic field as regarding the description of the magnetic field according to the series expansion on the base of orthogonal functions. Therefore the second approach allows to modify or impose at least partially a predetermined arrangement of values of components of the residual vector, that is of coefficients describing the compensated magnetic field referring to said series expansion based on orthogonal functions.

Alternatively or in combination it is possible to define a further constraint for magnetic moments of individual compensation dipoles and it consists in the fact that for each compensation dipole $D_1, \ldots D_n$ a maximum threshold value is defined, below which the value of magnetic moment $C_1, \ldots C_n$ of each compensation dipole $D_1, \ldots D_n$ has to remain.

Generally, but not in a limitative way, it is preferred that higher values of coefficients describing the compensated magnetic field are higher for higher orders of said coefficients and namely that higher values of components of the residual vector are associated to components rappresenting high order coefficients of the description of the compensated magnetic field with a series expansion based on orthogonal functions.

As an improvement the invention provides to combine the two approaches one after the other in a single compensating process.

Therefore according to the invention it is provided to carry out at least a first compensating step using the second approach;

Positioning compensation dipoles with respective magnetic moments defined in this way on the positioning grid;

Measuring the magnetic field compensated with compensation dipoles defined at previous step;

Therefore carrying out compensating steps at least according to one of the variants or improvements of the process previously disclosed and based on the first approach compensating inhomogeneities of the magnetic field.

Due to this expedient it is possible to impose to values of components of the residual vector in compensating steps conditions using criteria of the second approach, while subsequently the compensation is improved according to the criterion and in case improvements of the first compensating approach.

Thus mathematical and computational limits inherent in the second approach are advantageously overcome by at least partially using advantages due to this second approach and above disclosed.

Specifically, the method according to the present invention provides the following steps:

a) defining a surface enclosing a spatial volume permeated by the magnetic field of a magnetic structure;

b) describing said surface by means of a system of three-dimensional coordinates;

c) measuring the value of components of the magnetic field at least along one, two or all three directions of said system of three-dimensional coordinates inside said volume or at least on the surface;

d) generating a description of components of the magnetic field at least along one, two or three of said directions by means of a series expansion on the basis of an orthogonal set of functions $f_n$ till a predetermined maximum finite order at which the expansion is interrupted;

e) for at least one or for each component of the magnetic field, defining a inhomogeneity vector whose components are composed of coefficients of the series expansion at previous step and which vector describes the trend of the corresponding component of the magnetic field;

f) from the measured value of at least one or each component of the magnetic field achieving actual numerical values of components of the inhomogeneity vector of said at least one component or of each component of the magnetic field;

g) defining a three-dimensional or two-dimensional grid that univocally defines a finite number of positioning points P and which positioning points P have a predetermined position with respect to the spatial volume wherein the inhomogeneity of the magnetic field has to be corrected;

h) for at least one or for each component of the magnetic field mathematically describing the effect of the corresponding component of the magnetic field of a dipole $D_p$ positioned at any positioning point P of the two- or three-dimensional grid on the corresponding component of the magnetic field in volume enclosed by the surface, by means of a vector of effects $d_p$, whose components are composed of coefficients of the series expansion describing said component of the magnetic field generated by said dipole on the basis of a set of orthogonal functions $f_n$ said series being interrupted at the same order or at an upper order than the series describing the magnetic field in spatial volume;

i) for at least one or for each components of the magnetic field in spatial volume describing the combined effect on said component of the magnetic field in spatial volume which effect is generated by a set of dipoles each one having a different position on the position grid and each one being provided with its own magnetic moment, in the form of a linear combination of effect vector of each of said dipoles $D_p$;

i1) defining as the compensating residual vector $\vec{\rho}$ with components $\rho_1, \ldots \rho_N$ the vector of the difference of inhomogeneity vector $\vec{a}$ and of effect vector $\vec{d}$ defined as vectors having components $a_1, \ldots a_N$ and $d_1, \ldots, d_N$ respectively of the series expansion on the basis of orthogonal functions of the compensated magnetic field and of the magnetic field generated by compensation dipoles;

i2) for the value of each component $\rho_1, \ldots \rho_N$ of residual vector $\vec{\rho}$ imposing a corresponding value of maximum acceptable threshold $S_1, \ldots, S_N$;

i3) imposing an acceptable maximum value for each magnetic moments $c_p$ of individual compensation dipoles;

i4) calculating the number, the position in the positioning grid and the value of corresponding magnetic moments of one or more combinations of compensation dipoles satisfying conditions defined at steps i2) and i3);

i5) selecting among one or more combinations of compensation dipoles calculated at step i4) the one that provides the smallest value for the sum of squares of magnetic moments of compensation dipoles;

i6) arranging compensation dipoles determined at step i5) with the corresponding magnetic moments and in corresponding positions in the positioning grid;

i7) repeating steps a) to i);

j) for at least one or for each component of the magnetic field in spatial volume, determining the number, the position and the magnetic moment of magnetic dipoles to be positioned on the three-dimensional or two-dimensional grid by minimizing a certain norm, particularly the modulus of the difference between said linear combination of effect vectors of said dipoles on the three-dimensional or two-dimensional grid and the inhomogeneity vector of the corresponding component of the magnetic field obtained by measuring the magnetic field in spatial volume;

k) providing said magnetic dipoles determined at step j) and positioning them on the grid at corresponding positions.

In combination with what disclosed above at step i) the invention provides to minimize a function wherein in addition to minimizing said certain norm of the difference between the inhomogeneity vector of each individual component of the magnetic field and linear combination of effect vectors corresponding to said component of the magnetic field of compensation dipoles, the total magnetic moment of compensation dipoles provided for compensating inhomogeneity of magnetic field is also minimized.

Particularly at step i) the invention provides to minimize the following expression:

$$\left( \left\| \sum_{p=1}^{M} c_p \vec{d}_p + \vec{a} \right\| + \sum_{p=1}^{M} \lambda_p c_p^2 \right)$$

that is to calculate the previously defined expression (6). In order to calculate the value of $$\min \left( \left\| \sum_{p=1}^{M} c_p \vec{d}_p + \vec{a} \right\| + \sum_{p=1}^{M} \lambda_p c_p^2 \right) \quad (6)$$

it is possible to provide at step i) and in subsequent steps all variants and improvements previously described and regarding the first approach for solving the problem for the compensation of the magnetic field.

According to a further characteristic that can be provided in combination or as an alternative one an additional criterion is provided consisting in that as further constraint for magnetic moments of individual compensation dipoles, for each compensation dipole $D_1, \ldots, D_n$ a corresponding maximum threshold value $C_{threshold,1} \ldots C_{threshold,n}$ is defined below of which the value of the magnetic moment $C_1, \ldots C_n$ of the corresponding compensation dipole $D_1, \ldots D_n$, have to remain.

Advantageously the method composed of steps i1) to i7) can be carried out in an iterative way by particularly repeating steps i2) to i5) modifying, generally reducing, each time at least some thresholds $S_1, \ldots, S_N$ for components $\rho_1, \ldots \rho_N$ of residual vector $\vec{\rho}$ and/or the maximum acceptable value for each magnetic moments $c_p$ of individual compensation dipoles.

Steps i2) to i5) are repeated till constraints set by thresholds $S_1, \ldots S_N$ for components $\rho_1, \ldots \rho_N$ of residual vector $\vec{\rho}$ and/or by the maximum acceptable value for each magnetic moments $c_p$ of individual compensation dipoles allow to compute a solution or for a predetermined number of times allowing, at the end of the iterative repetition of steps i2) to i5) for the predetermined number of times and/or till the step that has given a solution, the continuation of the process with subsequent steps i6), i7), i) and/or in case with all further steps improving or changing the process.

For the computation at step i4) defined above and that is for calculating the number, the position in the positioning grid and the value of corresponding magnetic moments of one or more combinations of compensation dipoles satisfying conditions defined at steps i2) and i3) the invention provides the use of special algorithms called "quadratic programming" or "linear programming". A detailed description of these algorithms is given in: Coleman, T. F. and Y. Li, "A Reflective Newton Method for Minimizing a Quadratic Function Subject to Bounds on some of the Variables", SIAM Journal on Optimization, Vol. 6, Number 4, pp. 1040-1058, 1996 e Gill, P. E. and W. Murray, and M. H. Wright, Pratical Optimization, Academic Press, London, UK, 1981 for quadratic programming e Dantzig, G. B., A. Orden, and P. Wolfe, "Generalized Simplex Method for Minimizing a Linear form Under Inequality Constraints", Pacific Journal Math., Vol. 5, pp. 183-195 and Mehrotra, S., "On the Implementation of a Primal-Dual Interior Point Method", SIAM Journal on Optimization, Vol. 2, pp. 575-601, 1992 for linear programming.

Essentially these algorithms allow to determine the minimum of a function defining constraints to input data and to output data. However the drawback of these algorithms is that it is not sure that exists a solution for determined constraints to input data and to output data. The more wide imposed constraints are the more probable a solution exists.

According to a further variant as the function to be minimized it has been found to be advantageous to minimize the function $$\sum_{p=1}^{M} \lambda_p c_p^2.$$

Even regarding the iteration of steps i2) to i5) it is possible that for each iteration a subset of compensation dipoles is defined to be positioned on the grid similarly to what disclosed with reference to the first embodiment of the iterative method. It is also possible to position all compensation dipoles determined at first iterative step on the positioning grid. Than a second measurement of the component under examination of the magnetic field is carried out for determining the inhomogeneity vector that will be used for a subsequent iteration step, alternatively in the subsequent iteration step said first or second constraints being maintained or varied and again all components of compensating vectors of all possible compensation dipoles being determined included those defined in the previous compensating step or in said iteration step the values related to compensation dipoles, to position thereof and/or magnetic moment thereof being determined which have not been included in the compensation dipole subset defined in the previous iteration step.

Once the combination of compensation dipoles is defined within the second or a subsequent compensating step it is possible also in this second or further compensating step to select among compensation dipoles determined in said second or subsequent iteration step a new subset of compensation dipoles which can or at least partially do not coincide in position to compensation dipoles of the subset defined in the previous iteration step and to position said compensation dipoles of the new subset in corresponding positions of the positioning grid, by repeating the measurement of the magnetic field and the computation step disclosed above till the algorithm has a solution.

When such condition is reached it is possible to provide the execution of compensating steps according to the process based on the first compensating approach described hereinbefore or of one or more variants or one or more improvements and that provide the minimization of expression (6) as criteria for determining the combination of compensation dipoles.

Similarly to what disclosed above, steps for arranging dipoles partially compensating inhomogeneities and for a new measurement of the magnetic field in the volume under examination can be replaced by mathematical steps according to which the iteration is carried out only by means of a software, each time the magnetic field being determined by the partial compensation calculated in a theoretical way and not being measured.

Initial iteration steps for determining compensation dipoles by means of quadratic or linear programming can provide in combination a modification for each subsequent iteration step consisting in a reduction of constraints such that the partial solution converges progressively towards a solution that is considered an optimum one.

Obviously it is possible to provide a different sequence of said iteration steps and wherein a certain number of iteration steps for determining compensation dipoles is carried out by means of quadratic or linear programming and based on the second approach of the process for compensating the magnetic field is inserted to a certain number of minimizing steps according to the process based on one or more variants or on one or more improvements of the compensating process based on the first approach and it occurs always both if for each iteration step a subset of compensation dipoles is defined to be positioned on the grid, and if all the set of compensation dipoles determined in the iteration step in progress is considered.

A further aspect of the invention consists in a further improvement regarding initial iteration steps of the process for determining the combination of compensation dipoles. This process aims to identify in the space of possible solutions, the optimum solution avoiding alternative solutions that satisfy various criteria or constraints but that rappresent solutions introducing adverse local effects or effects that can partially compromise the quality of the compensation of inhomogeneities of the magnetic field.

The improvement that will be shown below is based on experimental observations.

The base concept is that the convergence of the solution of the numerical problem for determining the best solution for the combination of dipoles compensating inhomogeneities towards the best solution depends a lot on the starting condition and it is considerably influenced therefrom. Therefore the space of solutions and their quantitative and qualitative effectiveness may be examined providing a drastic initial perturbation of inhomogeneities. In a series of experiments carried out by applying the compensating method disclosed above in its different variants to magnetic fields wherein the inhomogeneity condition has been drastically changed by arranging magnetized bodies perturbing the magnetic field in the spatial volume under examination, for example by arranging magnetized members outside the volume under examination provided interposed between two poles generating the magnetic field of a MRI machine, it has been found that solutions provided by the method according to the previous invention, often and depending on configurations of magnetic fields disturbing or perturbing initial conditions, were better than solutions generated starting from initial inhomogeneities conditions of the not pertubed magnetic field under examination.

The problem was to define criteria for determining the type of perturbation and so the configuration and position of magnetized perturbing members that provided the best solutions even regarding different configurations of the magnetic field under examination and of means generating it.

Since from the theorical point of view the analysis of physics of such effect is rather complex, the solution provided by the present invention in order to insert an initial step or in case an intermediate step in the compensating method for drastically perturbing inhomogeneity conditions of the magnetic field to be compensated consists in:

a) generating an initial population of magnetic fields perturbed by means of perturbing fields different one with respect to the other and subjecting these perturbed magnetic fields to steps determining the combination of dipoles compensating said inhomogeneity, defining a fitness value of the solution calculated for each perturbed magnetic field regarding a known optimum solution;

b) determining a better starting perturbed magnetic field by means of an algorithm combining perturbed magnetic fields of step a), for example a genetic algorithm to which there is provided as the starting population the population of perturbed magnetic fields that has been experimentally and accidentally determined, meaning that if said perturbed magnetic field is used as the starting magnetic field for the iterative process determining the combination of dipoles compensating inhomogeneities it provides a combination of compensation dipoles having a fitness value over a specific threshold and it satisfies all criteria or constraints of process steps previously described and based on the first and/or second approach for the solution of the problem for determining a compensation of the magnetic field and that considering criteria or constraints in a separated way or in combination one with respect to the other that have been defined in the description of various variants or various improvements of the method.

From what said above advantages of the present invention are evident mainly consisting in having found a method based on real mathematical realization means and it can be carried out in finite and acceptable times for compensating inhomogenities of the magnetic field, such method considering not only the minimization of inhomogeneities below a predetermined threshold, but also the stability of the solution, the minimization of the number of compensation dipoles, the distribution of magnetic moments of compensation dipoles correspondingly to symmetry of the magnetic field under examination, the reduction of different charge sizes for dipoles, the distribution of coefficients describing the magnetic field according to predetermined distributions optimizing characteristics of the compensated field referring to specific applications or to specific uses. An important advantage is that the best mathematical or computational solution of algorithms or expressions is not looked for, but the solution considering all practical requirements even in a more balanced way for the specific application the magnetic field is intended for is looked for. That is achieved by driving the calculation algorithm towards the solution in the convergence step.

It is expressly pointed out that for clearness purposes the mathematical analysis and the description of the method has been made with regards to a mathematical description of the magnetic field based on a cartesian system with three orthogonal axes and the compensation of inhomogeneities in such system may occur only for one or for a part of components of the magnetic field or for each component of the magnetic field depending on the application the magnetic field is intended for.

Further improvements of the invention are object of subclaims.

FIG. 1 schematically shows a typical example of a magnetic structure associated to a positioning grid G for dipoles compensating inhomogeneities of the magnetic field $\vec{B}$. In a permanent magnet structure, the field is generated between two magnetic poles 101 and 201 arranged at a certain distance one with respect to the other and delimiting a cavity for housing the body under examination or a part thereof. In order to achieve a sufficiently image quality for guaranteeing diagnostic tests, the magnetic field must be homogeneous at least within a partial volume V of said cavity. Generally the magnetic field has a direction perpendicular to poles 101, 201. By defining the space with a system of three-dimensional cartesian coordinates x, y, z and by arranging poles 101, 201 according to planes parallel to the plane defined by axis x-y, the generated magnetic field must have the single component in the direction of axis z. Therefore there are not provided field variations or components of the magnetic field in the direction of axis y and x that is said components are equal to zero.

In reality, systematic errors, such as due to the fact that poles are not infinite and that entering openings are very close to volume V, as weel as constructional tolerances involve inhomogeneities in the magnetic field that generate not-null components in directions of axes x, y and homogeneity deviations in component z. Depending on the application the magnetic field is intended for, inhomogeneities must be at least limited to a maximum threshold: such threshold is different for each application and for example in MRI sector, tolerances related to magnetic field inside imaging valume, that is a volume wherein the anatomical district to be investigated is positioned are generally from some peak to peak ppm (parts per million) units to some dozens.

Obviously it is not possible to have a complete removal of inhomogeneities since the compensating method require the presence of compensation dipoles made of magnetized material having finite size and being positioned in the magnetic structure on a two-dimensional grid G at predetermined positioning points P defined by said grid G. Both the manufacture of compensation dipoles with a predetermined magnetic moment and positioning thereof are affected by tolerance errors.

Also from a mathematical point of view, tools for computing compensation dipoles as regards the position and magnetic moment do not provide right solutions. However such solutions would be senseless since for computation purposes it is advantageous to provide discretized positions for compensation dipoles and magnetic moments that can assume intensity values according to a discrete scale of possible values. All that in order to reduce both calculation times and operations for manufacturing individual compensation dipoles and for arranging and securing thereof. In this case, the compensating operation cost is high and closely related to realization time.

The base principle upon which some compensating systems work is to determine the number, magnetic moment and the position of compensation dipoles to be arranged on a positioning grid G at different positions P thereof in order to minimize inhomogeneity of the magnetic field leading magnetic field variation for components within a maximum acceptable variation threshold.

This operation may be considered as the minimization of the distance between an inhomogeneity vector of the magnetic field and a linear combination of inhomogeneity compensating effect vectors of each possible compensation dipole positioned on the positioning grid G.

Inhomogeneity vectors and inhomogeneity compensating effect vectors that are briefly defined as effect vectors and associated to each component of the magnetic field B, associated to each dipole d in a position p have components in a finite number composed of coefficients of a mathematical description of the magnetic field in the form of a series expansion based on a set of orthogonal functions that is interrupted at a predetermined order number of summation sign as disclosed in more detail in the introduction of the present application.

Figures 2, 3:
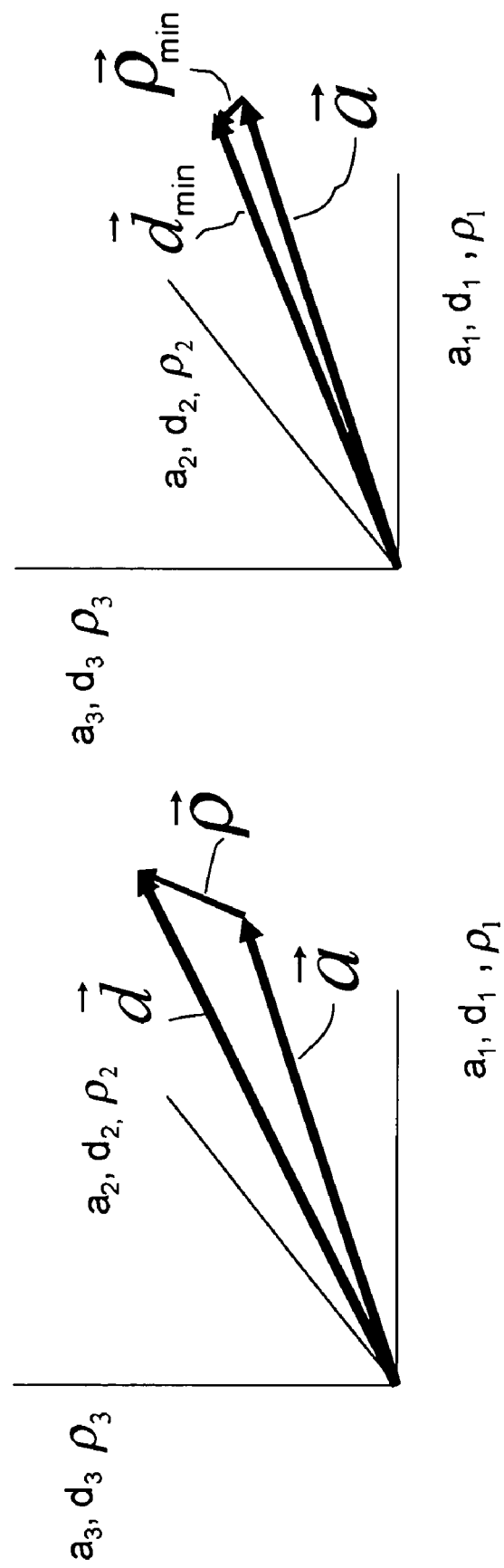
FIGS. 2 and 3 schematically show inhomogeneity vector of the magnetic field, total effect vector composed of the linear combination of individual effects of compensation dipoles and inhomogeneity residual vector before and after inhomogeneity compensation according to the present invention, for simplicity reasons there being provided only three components for said vectors, that is the equivalent of interrupting the series expansion based on a set of orthogonal functions at index or order 3.

FIGS. 2 and 3 show in a very schematic way the matter or the meaning of such operation, referring to a three-dimensional space that is a magnetic field description interrupted at term with index 3, the starting value of index being 1. Vector $\vec{a}$ is composed of components $a_1$, $a_2$, $a_3$ and in technical MRI sector is called inhomogeneity vector of magnetic field $\vec{B}$ or of a component $B_x$, $B_y$ or $B_z$. Vector $\vec{d}$ is composed of the linear combination of inhomogeneity compensating effect vector of individual compensation dipoles described by $$\sum_{p=1}^{M} c_p \vec{d}_p$$

wherein index p determines different possible positions of positioning grid G. Such linear combination comprises coefficients $c_p$ correlated or proportional to magnetic moment intensity values of compensation dipoles.

Vector $\vec{\rho}$ is the so called vector of the distance between the trend of the magnetic field or of one component of the magnetic field (referring to the shown example) and the trend of the magnetic field generated by compensation dipoles. Ideally, the operation for determining said compensation dipoles consists in making vector $\vec{d}$ identical and opposite in direction to vector $\vec{a}$ that is making minimum the modulus of vector $\vec{\rho}$ or however a function that has such modulus of vector $\vec{\rho}$ as the independent variable.

FIG. 3 shows the same vector $\vec{a}$ describing the trend of components of field $B_x$ or $B_y$ and d the vector $\vec{d}$ minimizing the length or modulus of vector $\vec{\rho}$ defined also as inhomogeneity residuals or residual inhomogeneity vector.

As already seen before, the invention provides different steps that can be combined one with the other in order to refine more and more the choice of the optimum solution among a set of solutions consisting in a set of compensation dipoles, each one having a predetermined magnetic moment and a predetermined relative position with respect to other dipoles and/or with respect to a spatial volume wherein it is desired for the magnetic field to be homogeneous, and which set of compensation dipoles is determined by minimizing a function wherein in addition to minimize said certain norm of the difference between inhomogeneity vector of each individual component of the magnetic field and the linear combination of effect vectors that corresponding to said magnetic field component of compensation dipoles, also the total magnetic moment of compensation dipoles provided for compensating the magnetic field inhomogeneity is also minimized.

The minimizing criterion herein disclosed is a specific case and widely used of the norm applied to the difference between inhomogeneity vector of the magnetic field and effect vector, that is the linear combination of effect vectors of individual compensation dipoles, however the method is not intended to be considered limited to such specific example and it can adopt any possible norm.

A first improvement refers to the fact that obviously among possible solutions, those minimizing the amount of compensation dipoles to be arranged on the grid and as well as the total amount of magnetic moment of compensation dipoles are preferred.

Referring to a norm example the disclosed embodiment of the method according to the present invention provides to use the below minimizing equation (6) in order to find the linear combination of compensation dipoles, position and magnetic moments thereof.

$$\min\left(\left|\sum_{p=1}^{M} c_p \vec{d}_p + \vec{a}\right| + \sum_{p=1}^{M} \lambda_p c_p^2\right) \quad (6)$$

The first summation substantially is the minimization of the distance, while the second summation is a term minimizing the sum of squares of magnetic moments of individual compensation dipoles each one being weighed by an individual weighing coefficient. As already mentioned such coefficient defined as attenuator or amplifier modulates the effect of each compensation dipole on the magnetic field whose inhomogeneity has to be compensated reaching various advantages already extensively disclosed in the introduction of the disclosure. Coefficients or weights $\lambda_p$ are empirically or experimentally defined.

Figure 22:
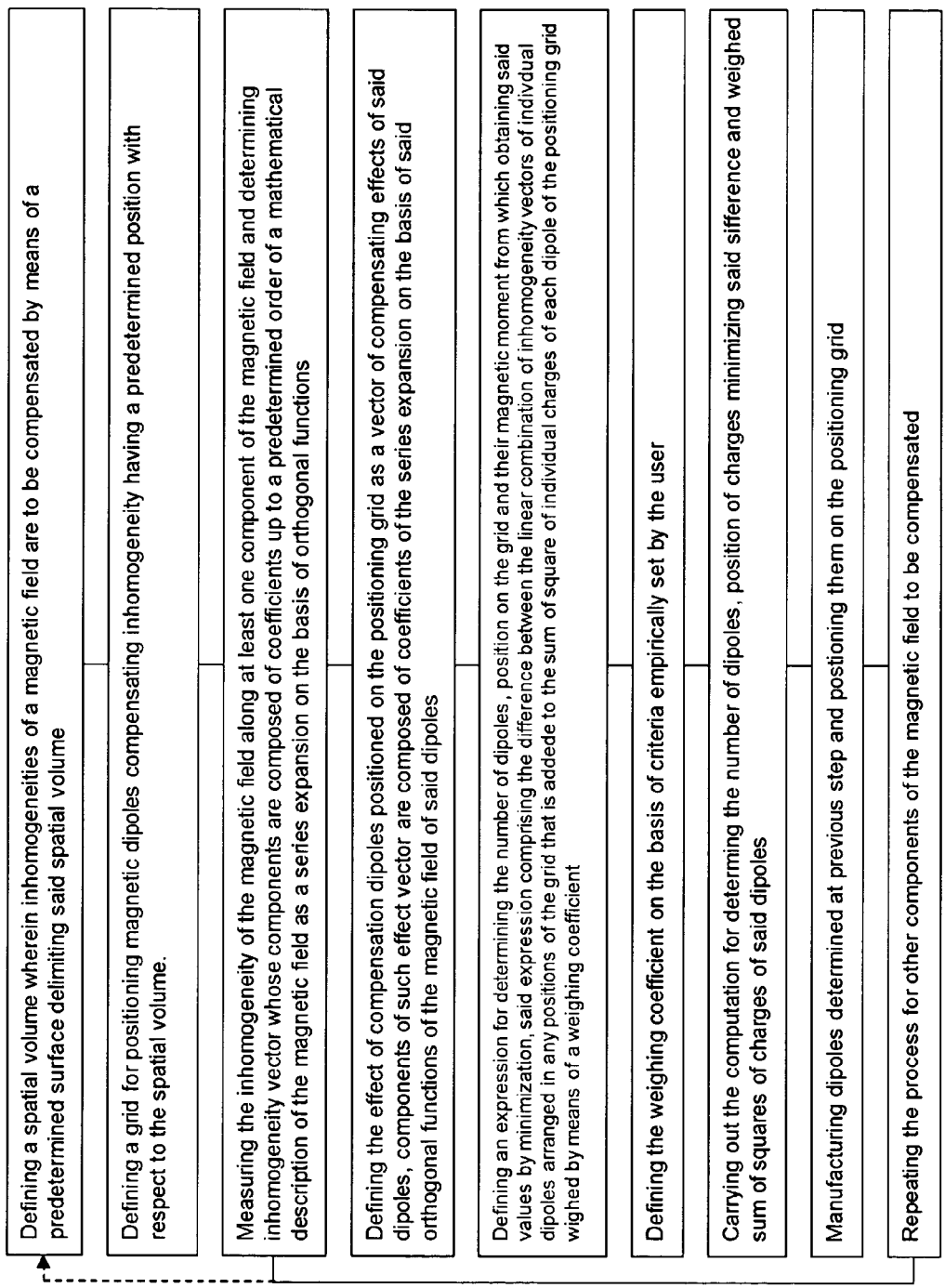
FIG. 22 shows the method according to the present invention providing the minimization of the inhomogeneity residual vector and of the amount of total weighed magnetic moment for groups of compensation dipoles and magnetic moment values thereof.

Steps for carrying out the method according to the invention related to this first embodiment are disclosed in the flow chart in FIG. 22.

A first refinement of the method according to the present invention is to provide an interation step execution with which it is possible to consider errors introduced in compensation for example due to tolerances during the practical construction of compensation dipoles regarding their magnetic moment and positioning tolerances during the practical execution of the operation for positioning compensation dipoles on the positioning grid G.

In this case the present invention provides to carry out the process for minimizing the expression indicated above by (6) by means of compensating iteration steps, wherein in each iteration step a subset of compensation dipoles is defined selecting a certain predetermined partial number of compensation dipoles among all compensation dipoles obtained by a first computation of the solution of expression (6). In each iteration step only these compensation dipoles of the selected subset are positioned on the positioning grid G. Then, a new measurement of the actual trend of the magnetic field is carried out for each component thereof and along the predetermined surface enclosing the spatial volume and/or in said spatial volume, wherein the magnetic field has to be made homogeneous. After the new measurement the step for computing the solution of expression (6) is repeated.

Second steps and each subsequent iteration step can be carried out according to two different modes.

In a first variant in the second iteration step and in following steps new subsets of compensation dipoles are defined which are different as regards position than compensation dipoles of subsets of compensation dipoles selected in the first and preceding compensating steps respectively, while compensation dipoles already positioned on grids are not considered when solutions are computed by calculating expression (6). In practice in the second or following iteration steps the calculation of expression (6) is carried out whose variables to be determined are referred only to compensation dipoles to positions still free on the positioning grid G.

Figure 4:
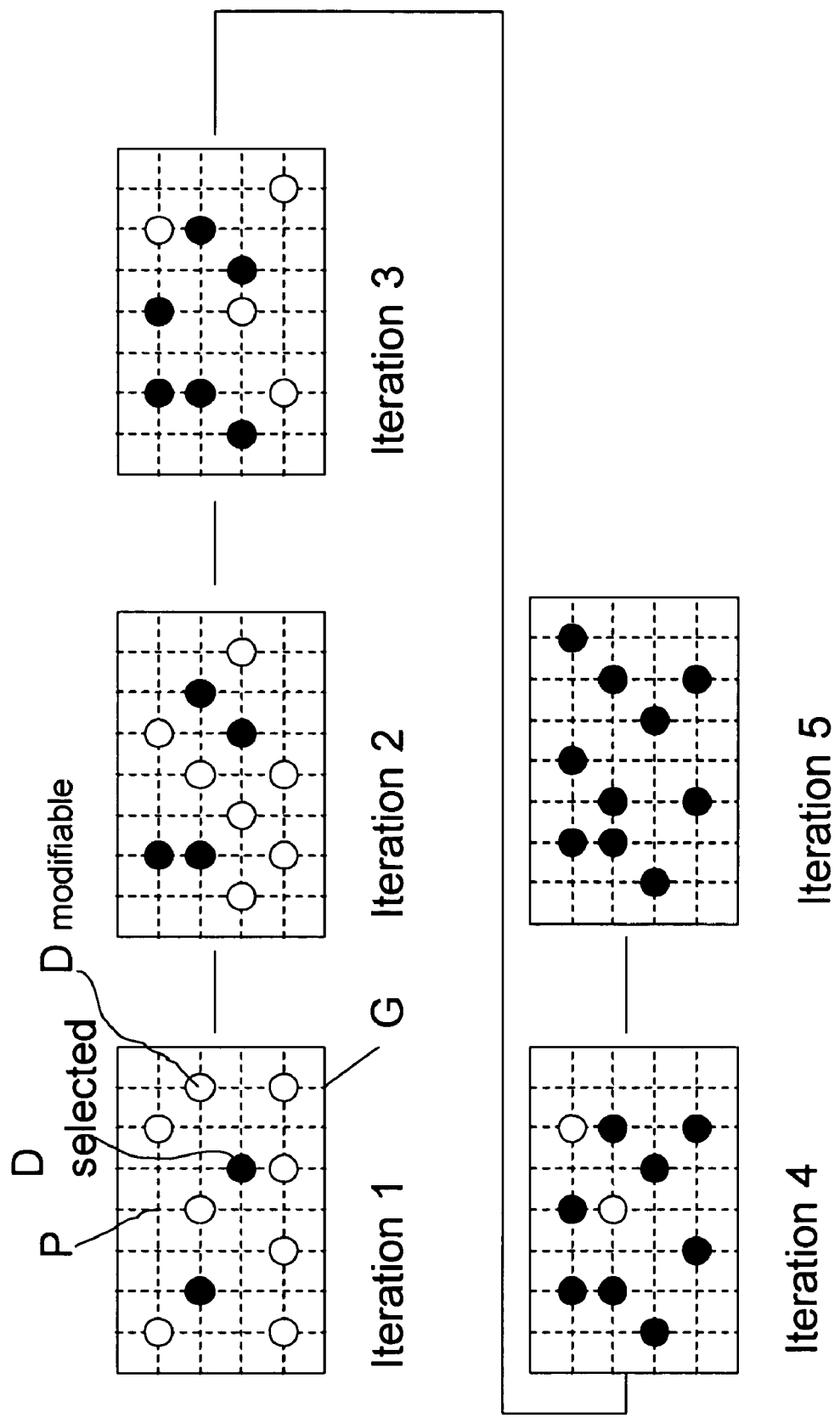
FIG. 4 schematically shows a simplified example of iterative steps for determining compensation dipoles according to the method of the present invention, the positioning grid and dipoles selected for each iteration steps being shown as part of the subset of compensation dipoles to be positioned on the positioning grid and those remaining can be modified and determined in the subsequent iteration step according to one variants of the method according to the invention carried out in iterative manner.
Figure 23:
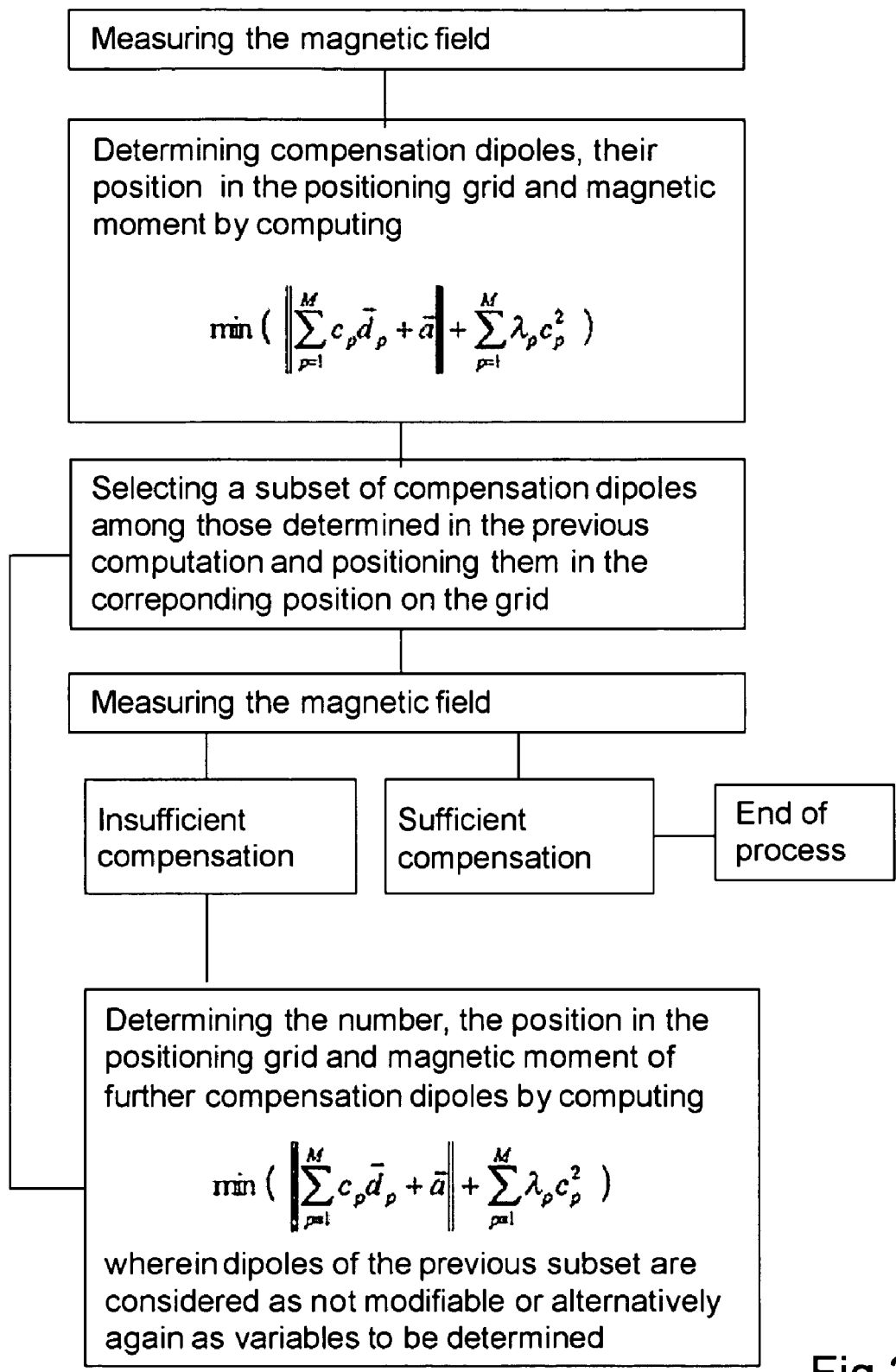
FIG. 23 shows a flow chart of the iterative determining method according to the present invention.

FIG. 4 and flow chart of FIG. 23 show this first variant for iteratively carrying out the compensating method.

The example in FIG. 4 shows five iteration steps. In the first step, after having measured the magnetic field on the surface enclosing the spatial volume wherein possible magnetic field inhomogeneities are desired to be compensated, for each magnetic field component a first compensation dipole subset is determined satisfying the expression (6). Among compensation dipoles defined by means of this minimizing operation some compensation dipoles are selected being part of a subset of compensation dipoles that will be arranged on the positioning grid at said first step. For semplicity reasons in the schematical example the compensation dipoles of the subset defined at individual iteration steps are only two and are pointed out in FIG. 4 by black circles. Only these one are positioned on the positioning grid G. Remaining compensation dipoles that at a first iteration step were not positioned on the positioning grid are considered as variables to be determined by means of computation of expression (6) in the following iteration step. Only for explanatory purposes these one are positioned as white circles on the grid at positions given thereto in the current iteration step. In following iteration steps there is provided the new measurement of the magnetic field partially compensated by the the arrangement of compensation dipoles on the positioning grid of compensation dipole subset defined at previous iteration step and then there is provided the computation of expression (6). In such following iteration step the computation of expression (6) provides a new compensation dipole combination that does not include those already positioned on the positioning grid. As can be seen in FIG. 4 compensation dipoles determined at following iteration steps cannot be coincident or can be coincident at least partially or totally with those not included in the subset defined at previous step and which were not included in the subset of compensation dipoles to be positioned on the positioning grid G. In the figure there is provided the condition according to which compensation dipoles resulting from the computation of expression (6) for each following iteration step do not coincide with those that have not been positioned on the grid in the previous iteration step in order to underline how field inhomogeneity conditions have been modified to deviate from those resulting from the mere numerical computation of expression (6) due to tolerances for practically manufacturing compensation dipoles and for positioning on the grid. Among compensation dipoles determined with expression (6) in the following iteration step again a subset of compensation dipoles is selected to be positioned on the positioning grid G and which comprises only two compensation dipoles in the specific example. Thus the iterative carrying out of the method allows the definition and the actual positioning thereof on the positioning grid of all compensation dipoles in order to achieve the compensation of magnetic field inhomogenities.

In FIG. 4 there are shown only five iteration steps and for each iteration step they provide to determine a number smaller and smaller of compensation dipoles and of which at each iteration step only a compensation dipole subset comprising two compensation dipoles is positioned on the positioning grid G In the example of FIG. 4, at each step two compensation dipoles are selected to be positioned on the grid G. However it is also possible for each step to select a different number of compensation dipoles depending on conditions.

A second variant for carrying out iteration steps is different from the one disclosed above since even if a compensation dipole subset to be positioned on the positioning grid G is determined in each iteration step, in the following iteration step, compensation dipoles positioned in the previous iteration step are anyway considered as variables of the expression (6). Therefore it is possible that the solution of expression (6) achieved in the following iteration step provides again compensation dipoles coinciding with those positioned in the first iteration step. In this case, in iteration steps in progress, in addition to dipoles of the new subset defined in this iteration step there are positioned on the grid, and in a position coinciding with corresponding compensation dipoles determined and positioned in the previous iteration steps, compensation dipoles having the same position of the latter. Essentially compensation dipoles already positioned on the positioning grid in previous iteration step are modified as regards their magnetic moment by adding the value thereof determined in the following iteration step in progress for these compensation dipoles.

Such second variant is not shown in details since it is graphically difficult to be represented.

It is possible to combine both different execution modes in any manner. For example it is possible to carry out the second variant for a certain number of steps, till the number of compensation dipoles to be positioned on the compensating grid is still higher than a certain number. Instead of or in combination it is possible to carry out alternately both variants for example the first variant for iteration steps having an odd order number and the second variant for iteration steps having an even order number or the carrying out of iteration steps according to one of the two variants is inserted after carrying out a certain number of subsequent iteration steps according to the other one of the two variants. It is also possible to relate the choice between one and the other one of the two variants to a numerical value indicating the compensation degree achieved by each iteration step. Such numerical value may be the numerical value given by expression (6) using the combination of compensation dipoles defined in the iteration step in progress or the difference between said numerical value than the same value resulting in the previous iteration step. By measuring the magnetic field at the beginning of each iteration step as the numerical value it is also possible to determine a value indicating the inhomogeneity degree of the partially compensated magnetic field which can be compared with the same numerical value determined at the previous iteration step. In the latest two cases, if the comparison between numerical values indicative of the compensation degree achieved in two subsequent iteration steps shows an improvement in the partial compensating effect, when a certain value of the difference between said numerical value is reached, it is possible to pass to the first variant for iteratively carrying out the compensating method, while the second variant is mantained or applied when the comparison of said numerical values, for example as already said their difference denotes a worsening of the partial inhomogeneity compensating degree.

The choice of how combining the two variants carrying out iterative steps for determining compensation dipoles of the magnetic field depends on contingent situations and criteria for determining said choice can be defined even depending on compensation precision requirements determined by use conditions of the magnetic field.

Within the scope of the iterative process mentioned above, it is possible to further improve or optimize the choice of possible compensating solutions included in a set of compensating solutions satisfying minimizing requirements of expression (6) with a limited and defined time effort.

The minimizing expression (6) can have different local minima and the computation thereof may lead to different solutions each one within a local minimum. Therefore it can exist a solution space comprising different alternative solutions satisfying the expression (6).

Moreover, considering that from a practical point of view, the solution of the equation (6) is carried out in a numerical way and not in analytical way, it will be numerically solved if the calculated solution, that is the achieved combination of compensation dipoles, will give a value of said equation (6) below a certain predetermined threshold. Such threshold is evidently proportional to the inhomogeneity compensating degree that in turn can be defined as the maximum acceptable variation of the magnetic field.

Generally in MRI applications the maximum variation value of the magnetic field is about 10 to 50 ppm (parts per million) peak to peak and therefore it is possible to define a threshold value even for the smallest value that the equation (6) has to give with a given solution, that is with a given combination of compensation dipoles.

Even this consideration shows that there are more alternative solutions satisfying criteria imposed by expression (6).

Therefore such condition gives the possibility to provide further refinement steps for the compensating method in order to identify and select the solution that can be considered as the best one in the space of possible acceptable compensating solutions.

A first criterion for selecting the best solution is to identify a solution within the acceptable solution space consisting in a compensation dipole set wherein individual compensation dipoles have magnetic moment intensity values that are only included in a discrete scale of said values, and wherein variation stage or step of the discrete intensity value of the magnetic moment is a constant one. For example discrete scales of magnetic moment intensity values providing only values corresponding to entire multiples of a unit intensity value of the magnetic moment or of a fraction of said unit value, for example to an half of said unit intensity value of the magnetic moment can be selected.

The advantage in determining and preferring said solutions consists in semplifying and making faster operations for constructing compensation dipoles by modular members provided with particular predetermined magnetic moment intensity values. When the discrete scale provides only multiples of unit values it is possible to provide only magnetized members having intensity magnetic moment with unit value. The choice preferring solutions wherein magnetic moments of compensation dipoles have discrete values allows to limit errors when assembling individual magnetized members and to limit the number of magnetized base members having different magnetic moment intensities in addition to make easier the construction of magnetic dipoles.

Referring to FIGS. 7 to 15, still by means of iteratively carrying out the minimizing computation, the invention allows also to subject magnetic moment intensity values of compensation dipoles determined by computing expression (6) or (6') to a kind of perturbation calculation.

The iterative mode for carrying out the compensating method allows to carry out the perturbation calculation for a restricted number of compensation dipoles, that is for each iteration step only compensation dipoles being part of the compensation dipole sub-et defined in said iteration step of the method.

The perturbation calculation and the choice of the the solution consisting in a predetermined combination of said compensation dipole subset having different intensity values modified by the perturbation is carried out as follows:

For each magnetic moment intensity value of each compensation dipoles within said compensation dipole subset defined at an iteration step there is defined a maximum variation range whose limit values are coincident with a discrete value of a discrete value scale of said magnetic moment intensity that has been previously selected and defined. One of the two discrete limit values is selected to be greater than or equal to the magnetic moment intensity value of each compensation dipole of the subset as determined by computing the expression (6) or (6'), while the other value is selected to be smaller than or equal to said value determined by computing the expression (6) or (6'). The two limit values can be selected such that the variation range is equal to a multiple of discrete variation steps defined by said discrete scale for magnetic moment intensity values. Therefore for each compensation dipole being part of the subset, the corresponding magnetic moment value is varied by giving each discrete values provided in the defined variation range thereto, therefore a plurality of compensation dipole subsets being generated each one providing one of the different possible combinations of modified magnetic moment intensity values for dipoles of said subset.

Therefore the compensating effect is calculated for each of said subsets wherein compensation dipoles have magnetic moment intensity values modifed according to one of the possible combinations. Essentially that occurs by re-calculating the expression (6') for magnetic moment values of of dipoles of the subset with modified magnetic moment intensity values.

Obviously the best solution is considered to be the combination of compensation dipoles whose compensation dipole subset with modified magnetic moment intensity values provides the smallest value of the expression (6).

As pointed out above in fact practically it is often sufficient for the solution to provide a value of the expression (6) that is smaller than a certain maximum threshold value that is related to or is a function of or is proportional to maximum acceptable inhomogeneity degree for the specific application, that is to variation tolerance of the magnetic field in the spatial volume under examination. In this case, there will be considered as best solutions the ones for which the compensation dipole subset comprising compensation dipole subsets having different combinations of modified magnetic moment values provides a value for the expression (6) that is below said threshold. According to a first selection criterion variant, as the best combination of modified magnetic moment values it is selected the one providing the smallest value when computing the expression (6).

For example by setting discrete variation steps of the magnetic moment intensity value of compensation dipoles equal to a half of unit value of the magnetic moment intensity, for manufacturing dipoles to be actually arranged on the positioning grid G of the magnetic structure there will be necessary only magnetized members having unit values of magnetic moment intensity or multiples of said unit value and magnetized members having a value equal to half of the unit value.

FIGS. 7 to 15 consider all combinations of magnetic moment variations of the two compensation dipoles forming an example subset selected during the first iteration step of the compensating method. Said two dipoles indicated by a black circle and with d1 and d2 differ from compensation dipoles do not included in the subset defined at iteration step in progress since the latter are indicated by white circles. The variation range of the magnetic moment intensity value is selected equal to an half of the unit value of magnetic moment intensity from the discrete value set in the magnetic moment intensity value discrete scale selected closer to magnetic moment intensity value of said dipoles calculated by expression (6).

The shown example is very simplified in order to reduce the number of combinations that otherwise would be a considerable one and in order to point out the principle the method perturbating the intensity value of the magnetic field is based on. In FIG. 7 dipoles d1 and d2 are already shown in the condition of the value of the corresponding magnetic moment modified to one of discrete values defined by variation range and by the selected discrete scale. The example refers to the first iterative computational step of FIG. 4.

As already pointed out above it is possible to establish a maximum threshold of the value provided by the expression (6) for different compensation dipole sets comprising the subset of compensation dipoles having different combinations of modified magnetic moment intensity values, thereby a certain number of said sets or all sets can provide values below the threshold therefore rappresenting acceptable compensating solutions.

In this case the above criterion establishes that the choise of the best solution is the compensation dipole set providing the smallest value for the expression (6).

However it is also possible to use further criteria for selecting the solution to be considered the best one for the compensation among said acceptable solutions.

Such selection criteria may consist in a further step for refining the method with regard to the analysis of further characteristics of the compensated magnetic field, which characteristics may be more important than the fact that the solution is more or less below said threshold, that is it provides an homogeneity level of the field more or less below the predetermined minimum level.

A criterion that can be considered an important one particularly referring to the compensation of inhomogeneities of a static magnetic field of a magnetic structure applied to MRI machine, consists of the fact that the trend of the compensated field has a final and overall trend of the compensated magnetic field that is substantially flattened ("smooth") namely with the smallest peak to peak oscillation/amplitude. A restricted peak to peak oscillation/amplitude in the trend of the compensated field avoids for the field to have locally considerable variations that can lead to local generation of noise during imaging.

Therefore the invention provides to choose among above defined compensation dipole sets being acceptable solutions for the problem of compensating inhomogeneities, the solution, that is the compensation dipole set providing a trend of the compensated magnetic field with the smallest peak to peak amplitude or with the peak to peak amplitude below a predetermined maximum threshold value.

FIGS. 5 and 6 schematically show mechanisms at the base of the above mentioned second criterion for selecting the best compensating solution for the magnetic field. Hence from FIGS. 5 and 6 it results that for example the combination of two dipoles introducing effects with small amplitudes in the field variation do not necessarily lead to an overall effect on the compensated field better than the combination of two dipoles whose separated effect has a greater amplitude in the field variation.

FIGS. 5 and 6 show the effect on the magnetic field of a single dipole 1 and of a single dipole 2 and the effect of the linear combination of two dipoles 1 and 2 respectively.

It is evident that amplitudes of magnetic field trend resulting from the effect of individual dipoles is better for the solution of FIG. 6, the combined effect of the two dipoles is better for the solution of FIG. 5, even if both solutions satisfy the condition of having a value of the expression (6) below a predetermined maximum threshold.

Therefore the method according to the present invention in combination with the first criterion for discretizing magnetic moment intensity values of compensation dipoles provides to use said second criterion for selecting the combination of compensation dipoles for which the compensated field has the smallest peak to peak amplitude.

As regarding the iterative carrying out of the compensating method, for each iteration step there is selected the combination of compensation dipoles of the corresponding subset and having modified magnetic moment intensity values that provides a value of expression (6) smaller than a predetermined maximum threshold value and for which the compensated field has a trend with the smallest peak to peak amplitude or with the peak to peak amplitude below a predetermined maximum threshold value.

Therefore the trend of the compensated field regarding various components of the magnetic field for each combination dipole sets having a compensation dipole subset with a modified value of magnetic moment intensity and providing a value of the expression (6) below a predetermined maximum threshold is calculated for each iteration step. The peak to peak oscillation/amplitude from such trend of the compensated magnetic field is calculated for each of said compensation dipole sets and therefore the compensation dipole set is determined according to which the peak to peak oscillation/amplitude of the corresponding trend of the compensated field corresponds to the smallest value.

Figure 16:
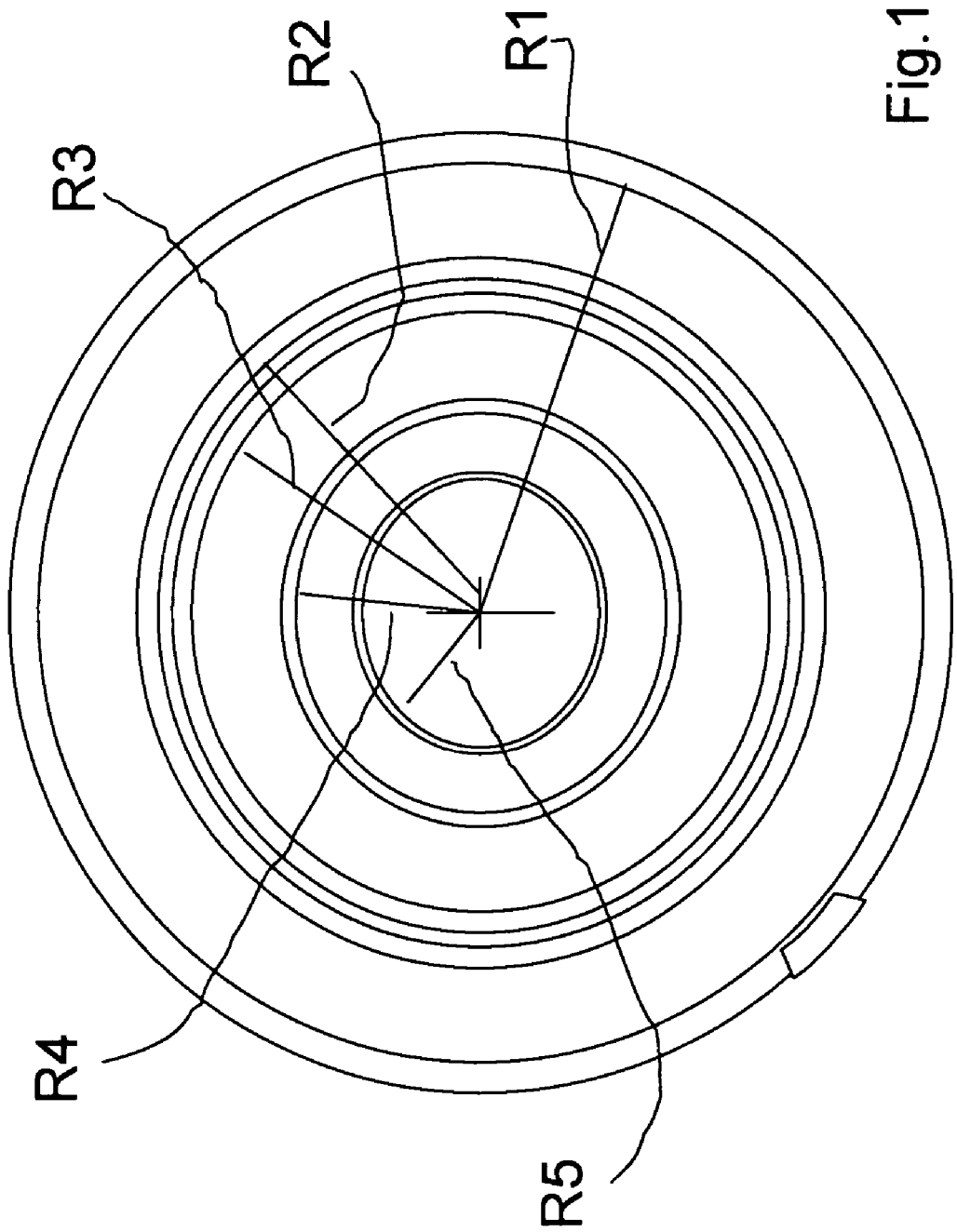
FIG. 16 shows an annular grid upon which compensation dipoles are realized as annular distributions of compensating magnetic moments having different radii each ring being formed by individual members like an annular sector, in the figure only one thereof being pointed out.

All method steps disclosed above are considerably semplified when the magnetic field has a predetermined symmetry and particularly when the latter is an axial symmetry. In this case, the compensating effect with respect to position of compensation dipoles depends only on the radius. Therefore, the position variable is restricted to the radius and the moment magnetic intensity value of a compensation dipole for a specific radius can be distributed on an annular member with the predetermined radius. FIG. 16 shows such positioning grid using annular compensating members. In the example the grid has five annular compensating members with radii R1, R2, R3, R4 and R5. Each annular member is composed of individual magnetized members having the same size and predetermined magnetic moments which members are arranged along a circular positioning line. Thus the grid has a series of circular positioning lines referring to a discretized radius series of concentric circles according to variation steps of radii of predetermined amplitude.

It is to be noted that computation of the compensation is considerably semplified in the presence of the axial symmetry.

The compensation method disclosed till now determines the compensating dispole combination to be positioned on a predetermined grid and having a predetermined magnetic moment considering mainly the minimizing criterion of the following expression:

$$\min\left(\left\|\sum_{p=1}^{M} c_p \vec{d}_p + \vec{a}\right\| + \sum_{p=1}^{M} \lambda_p c_p^2\right). \tag{6}$$

According to a variant that can be carried out alternatively or in combination with the previous method, if a vector of inhomogeneity residuals of the compensated magnetic field is defined as said vector called p according to the following expression:

$$\sum_{p=1}^{M} c_p \vec{d}_p + \vec{a} = \vec{\rho} \tag{6''}$$

so the criterion for determining the compensation according to said variant and described by the expression (6') is to impose for the vector $\vec{\rho}$ to be within a sphere with a predetermined radius.

However such criterion does not influence the arrangement of magnitudes of individual components of residual vector $\vec{\rho}$. Said inhomogeneity residual vector $\vec{\rho}$ similarly to inhomogeneity vector has components $\rho_1, \ldots \rho_n$, that are composed of coefficients of the series expansion based on same orthogonal functions $f_n$ described hereinbefore of the compensated magnetic field. Components $\rho_1, \ldots \rho_n$ of vector $\vec{\rho}$ constitute individual coefficients describing residual inhomoegenities of the compensated magnetic field according to said series expansion.

Therefore it is possible to define a second approach for the solution of the problem for compensating the magnetic field that instead of considering to determine compensation dipoles by calculating the expression (6) it considers calculating compensation dipoles such to put constraints on the distribution of values of individual coefficients $\rho_1 \ldots \rho_n$ of the residual vector $\vec{\rho}$. Such constraints identify a set of possible compensating solutions.

However this condition may not be sufficient and it has to be provided in combination with a further constraint.

As a second constraint it is possible to consider that each compensation dipole $D_1, \ldots, D_n$ must have a magnetic moment that is smaller or equal to a maximum threshold value $C_{threshold,1} \ldots C_{threshold,n}$ univocally associated to said compensation dipole and below which the value of magnetic moment $C_1, \ldots C_n$ of the corresponding compensation dipole $D_1, \ldots D_n$ has to remain.

Even such constraint defines a set, generally a different one, of possible compensating solutions.

Inside this set of solutions it is possible for example to use a selection criterion consisting in minimizing the sum of squares of magnetic moments of compensation dipoles.

Therefore the invention provides to use said second approach for an initial step determining compensation dipoles of the magnetic field.

Particularly the application of the second approach can alternatively or in combination provide the following constraints:

For the distribution of values of components of the residual vector $\vec{\rho}$ the assigning of a maximum and/or minimum threshold value $S_1, \ldots, S_n$ for each components $\rho_n, \ldots \rho_n$ of said residual vector and for the definition of compensation dipoles, of their positions and magnetic moments thereof, for each compensation dipoles $D_1, \ldots D_n$ a corresponding maximum threshold value $C_{threshold,1} \ldots, C_{threshold,n}$ is defined below which the value of magnetic moment $C_1, \ldots C_n$ of the corresponding dipole $D_1, \ldots D_n$ has to remain.

The method according to the invention provides at least the following initial steps:

a) defining a surface enclosing a spatial volume permeated by the magnetic field of a magnetic structure;

b) describing said surface by means of a system of three-dimensional coordinates;

c) measuring the value of components of the magnetic field along at least one, two or all three directions of said system of three-dimensional coordinates;

d) generating a description of components of the magnetic field along at least one, two or three said directions by means of a series expansion based on an orthogonal set of functions $f_n$ up to a predetermined finite maximum order at which the expansion is truncated.

e) for at least one or for each component of the magnetic field, defining an inhomogeneity vector whose components are composed of coefficients of the series expansion about which at previous step and which vector describes the trend of the corresponding component of the magnetic field;

f) from the measured value of at least one or of each components of the magnetic field obtaining actual numerical values of components of the inhomogeneity vector of said at least one component or of each component of the magnetic field;

g) defining a three-dimensional or two-dimensional grid that univocally defines a finite number of positioning points P and which positioning points P have a predetermined position with respect to spatial volume wherein the magnetic field inhomogeneity has to be corrected;

h) for at least one or for each components of the magnetic field mathematically describing the effect of the corresponding component of the magnetic field of a dipole $D_p$ positioned in any positioning points P of the two- or three-dimensional grid on the corresponding component of the magnetic field in the volume enclosed by the surface, by means of an effect vector $d_p$, whose components are composed of coefficients of the series expansion, which describes said component of the magnetic field generated by said dipole based on a set of orthogonal functions $f_n$, said series being truncated at the same or upper order than the series describing the magnetic field in spatial volume;

i) for at least one or for each component of the magnetic field in spatial volume describing the combined effect on said component of the magnetic field in spatial volume which effect is generated by a set of dipoles each one lying in a different position on the position grid and each one is provided with its own magnetic moment, in the form of a linear combination of effect vectors of each of said dipoles $D_p$;

i1) defining as the compensating residual vector $\vec{\rho}$ with components $\rho_1, \ldots \rho_N$ the vector of the sum of the of inhomogeneity vector $\vec{a}$ and of the effect vector $\vec{d}$ defined as vectors having components $a_1, \ldots a_N$ and $d_1, \ldots, d_N$ respectively of the series expansion on the basis of orthogonal functions of the compensated magnetic field and of the magnetic field generated by compensation dipoles;

i2) for the value of each component $\rho_1, \ldots \rho_N$ of residual vector $\vec{\rho}$ imposing a corresponding value of maximum acceptable threshold $S_1, \ldots, S_N$;

i3) imposing an acceptable maximum value for each magnetic moments $c_p$ of individual compensation dipoles;

i4) calculating the number, the position in the positioning grid and the value of corresponding magnetic moments of one or more combinations of compensation dipoles satisfying conditions defined at steps i2) and i3);

i5) selecting among one or more combinations of compensation dipoles calculated at step i4) the one that provides the smallest value for the sum of magnetic moment squares of compensation dipoles;

i6) arranging compensation dipoles determined at step i5) with the corresponding magnetic moments in corresponding positions in the positioning grid;

i7) repeating steps a) to i);

j) for at least one or for each component of the magnetic field in spatial volume, determining the number, the position and the magnetic moment of magnetic dipoles to be positioned on the three-dimensional or two-dimensional grid by minimizing a certain norm, particularly the modulus of the difference between said linear combination of effect vectors of said dipoles on the three-dimensional or two-dimensional grid and the inhomogeneity vector of the corresponding component of the magnetic field obtained by measuring the magnetic field in spatial volume;

k) providing said magnetic dipoles determined at step j) and positioning them on the grid at corresponding positions.

l) repeating steps c) to i) and then m) for at least one or each components of the magnetic field in spatial volume determining the number, position and magnetic moment of magnetic dipoles to be located on the three-dimensional or two-dimensional grid minimizing a certain norm, particularly the modulus of the difference between said linear combination of effect vectors of said dipoles on two-dimensional or three-dimensional grid and the inhomogeneity vector of the corresponding component of the magnetic field obtained by measuring the magnetic field in spatial volume according to one or more variants provided by the method according to the criterion of said first approach.

Before passing to step k) or l), that is before going on with the calculation for determining compensation dipoles according to the first approach it is possible to repeat iteratively once or more times steps i2) and J and/or i3) and J) using each time threshold values $S_1, \ldots S_n$ at least partially different than those of the previous step and/or at least partially different from maximum acceptable values of magnetic moments of compensation dipoles respectively.

After the first execution of step j) and step k) it is also possible to provide iteratively once or more times the repetition of steps c) to k) using each time threshold values $S_1, \ldots, S_n$ at least partially different from those of the previous step.

As regards the distribution of values of components $\rho_1, \ldots \rho_n$ of the residual vector $\vec{\rho}$, defined by threshold values $S_1, \ldots, S_n$, it does not exist an universal criterion defining the best distribution, but it is determined by contingent conditions and by applications of the compensated magnetic field. However generally it is preferred for values of components $\rho_1, \ldots \rho_n$ of the residual vector $\vec{\rho}$ to be greater for components with high order, and to be smaller or negligible for components of high order.

FIGS. 18 and 19 schematically show that by using the first approach of the method according to one or more disclosed variants that provides to determine compensation dipoles with expression (6) exist various values of components of the vector $\vec{\rho}$ that satisfy said expression (6). The example of FIGS. 18 and 19 is restricted to only two combinations that can be easily deduced even graphically if it is considered the fact that the example refers to a vector with only three components. In this case the modulus of the vector is the same by inverting values between the first and the third component. However one of the two solutions is surely preferred according to agreed but not limitative points of view, since generally it is preferred for example for components of smaller value to be associated to coefficient of the series expansion of lower order, components of vector being a rappresentation of coefficients of the series expansion of the magnetic field.

Figure 25:
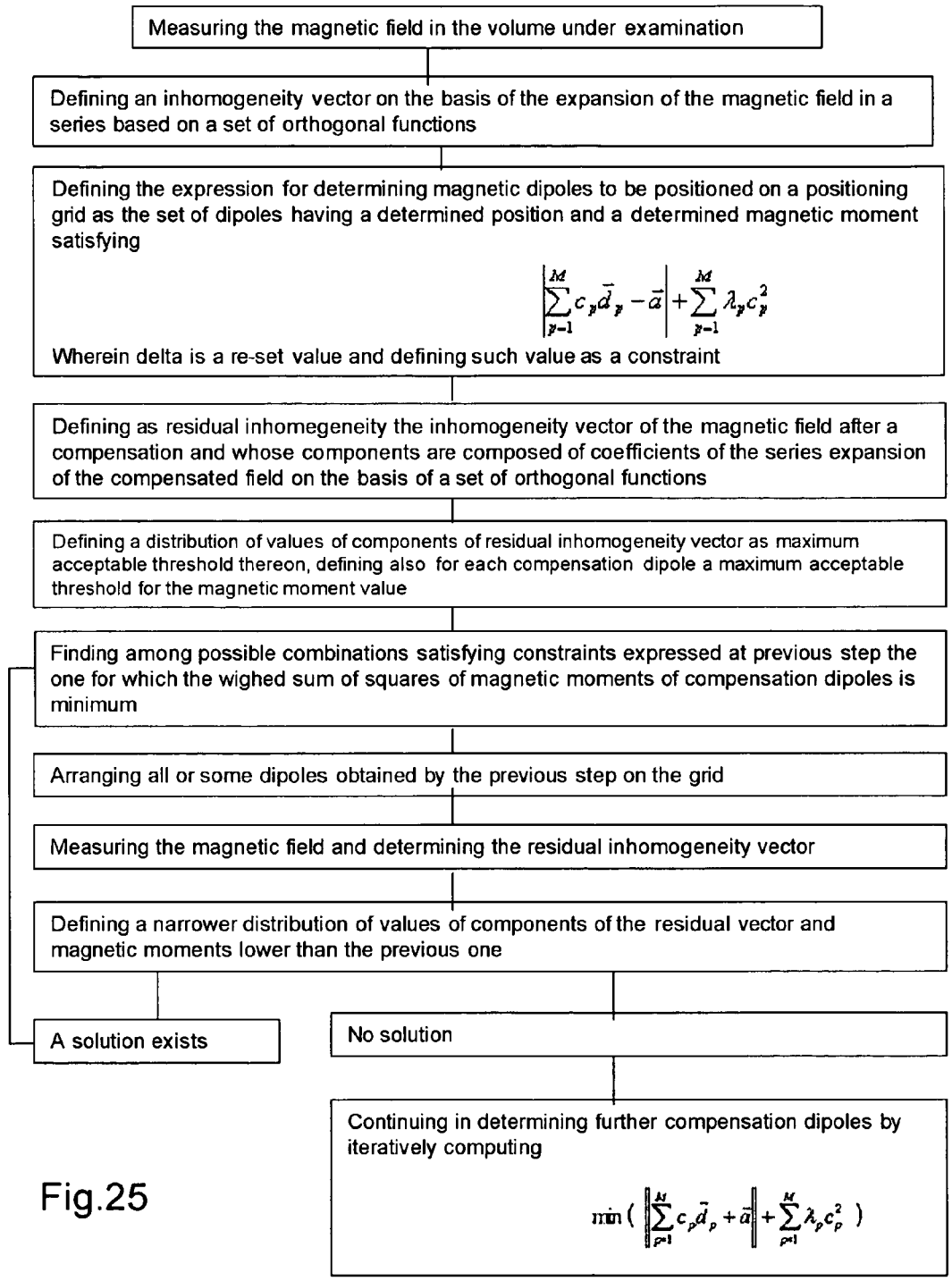
FIG. 25 shows the flow chart of an improvement of the method according to the invention wherein an initial step for partially calculating compensation dipoles by means of quadratic or linear programming is provided.

As indicated also by the flow chart of FIG. 25 it is possible to provide initial steps determining a solution compensating the magnetic field that use algorithms known as "quadratic programming" or "linear programming" (see more specifically page 50-51) which allow to determine compensation dipoles or at least a part thereof considering initial constraints that is input data and final constraints that is output data and that in the present case are composed of the imposed distribution of values of components of the residual vector and of the fact that magnetic moment values are smaller or equal to a predetermined threshold as hereinbefore defined.

Since it is not always sure for the above computational algorithm to have a space of solutions referring to said constraints, the invention suggests to use such algorithm only for initial steps computing compensation dipoles that are first steps for determining dipoles compensating inhomogeneities. For the above reasons said initial steps are carried out in an iterative way as previously shown in details, setting constraints in a substantially wide way in the first step and restricting progressively said constraints for each step till the algorithm does not provide more solutions. In this case, as results also from the flow chart of FIG. 25, compensation dipoles previously determined as partial solution similarly to the iterative process minimizing the expression (6) are kept firm and iterative minimizing steps according to one or more of the above variants go on.

This mode guarantees the direction of the process determining compensation dipoles towards a solution satisfying technical requirements required by physical or constructive considerations and necessities or anyway to avoid the minimization process to follow a casual path that can lead to fall in a local minimum constituting a solution that is non optimal with respect to further possible solutions in the space of solutions. Particularly the solution consisting in determining the best combination of compensation dipoles is directed from first steps determining said combination of compensation dipoles towards a combination of compensation dipoles satisfying at least partially or it is partially controlled as regards the distribution of values of components of the residual vector and therefore of coefficients describing the compensated magnetic field for which the residual inhomogeneity is greater.

Figure 21:
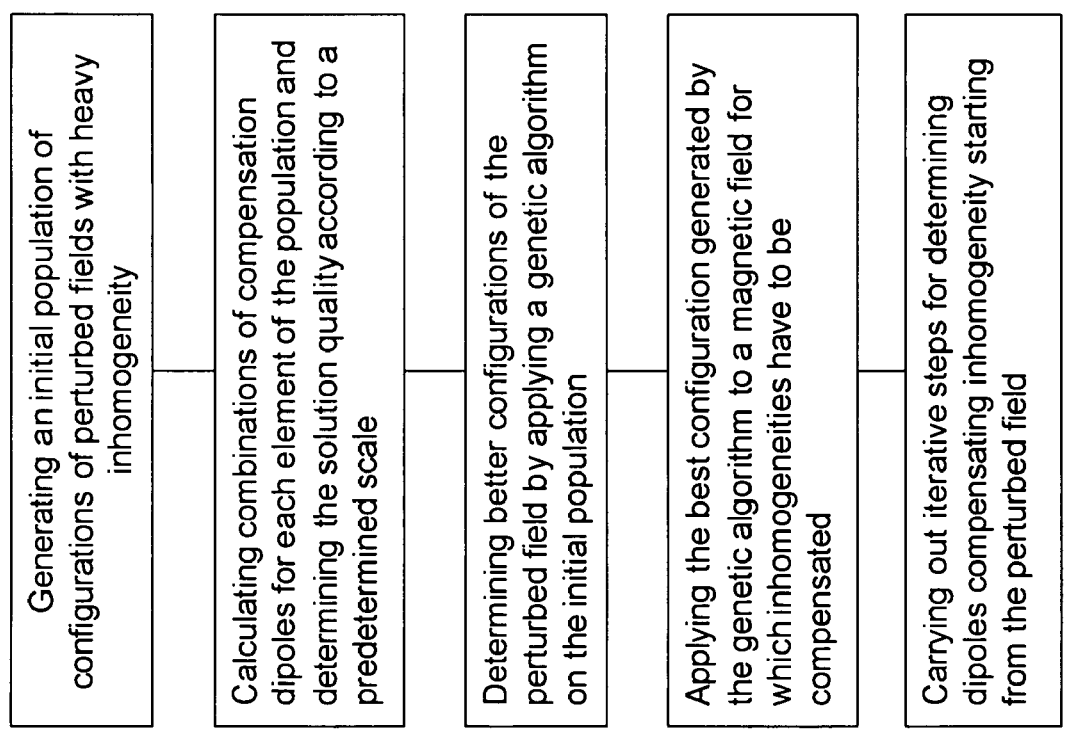
FIG. 21 shows a flow chart wherein steps for computing the best initial perturbation of inhomogeneity are listed in order to achieve a better compensation.

FIG. 20 in combination with flow chart of FIG. 21 show a further improvement of the method based on the fact that by altering initial inhomogeneity conditions of the field in an aimed manner, the solution for the compensation thereof provided with one or more of the preceding variants of the method considerably improves.

In practice it consists in providing a magnetized member 301 for the perturbation of inhomogeneity condition in the sense of altering thereof in an aimed manner and so to achieve, when the process ends, a static magnetic field with a better homogeneity characteristic or to achieve faster an optimum solution for compensating inhomogeneities of the magnetic field.

Experimentally it has been found that in certain conditions, by starting with apparently or numerically worse conditions, the final compensation of inhomogeneities has been resulted as a better one or it can faster be achieved than starting from better conditions that is a smaller inhomogeneity and obviously using the same method for calculating compensation dipoles.

The problem of defining the best type of initial perturbation of inhomogeneity may be empirically solved as well as it can be numerically faced or with computation means. The invention for such aim provides initial steps for determining the best perturbation condition of inhomogeneity of the magnetic field along the field component under examination and therefore the execution of iterative steps calculating compensation dipoles according to one or more variants that have been previously disclosed.

Starting from a population of perturbations that are different one with respect to the other and experimentally defined and a so called fitness value is associated thereto based on quantitative criteria estimating the compensation achieved starting from each perturbed field with one of the different perturbation configurations that is with one of the different perturbation field it is possible to generate perturbation fields and so to go back to configuration of means for generating said fields optimizing the fitness, that is leading to a better compensation solution than the initial experimentally defined population by means of using an evolutive algorithm and specifically a genetic algorithm.

Fitness criteria are obvious from what said above and can comprise one or more conditions listed in various variants or in various improvements, such as the minimization of expression (6) and/or of the modulus of residual vector, the reduction of the number of compensation dipoles and/or of the total magnetic moment thereof, the reduction of the peak to peak amplitude of the compensated field, a better distribution of values on various components of the compensating residual vector.

Figure 26:
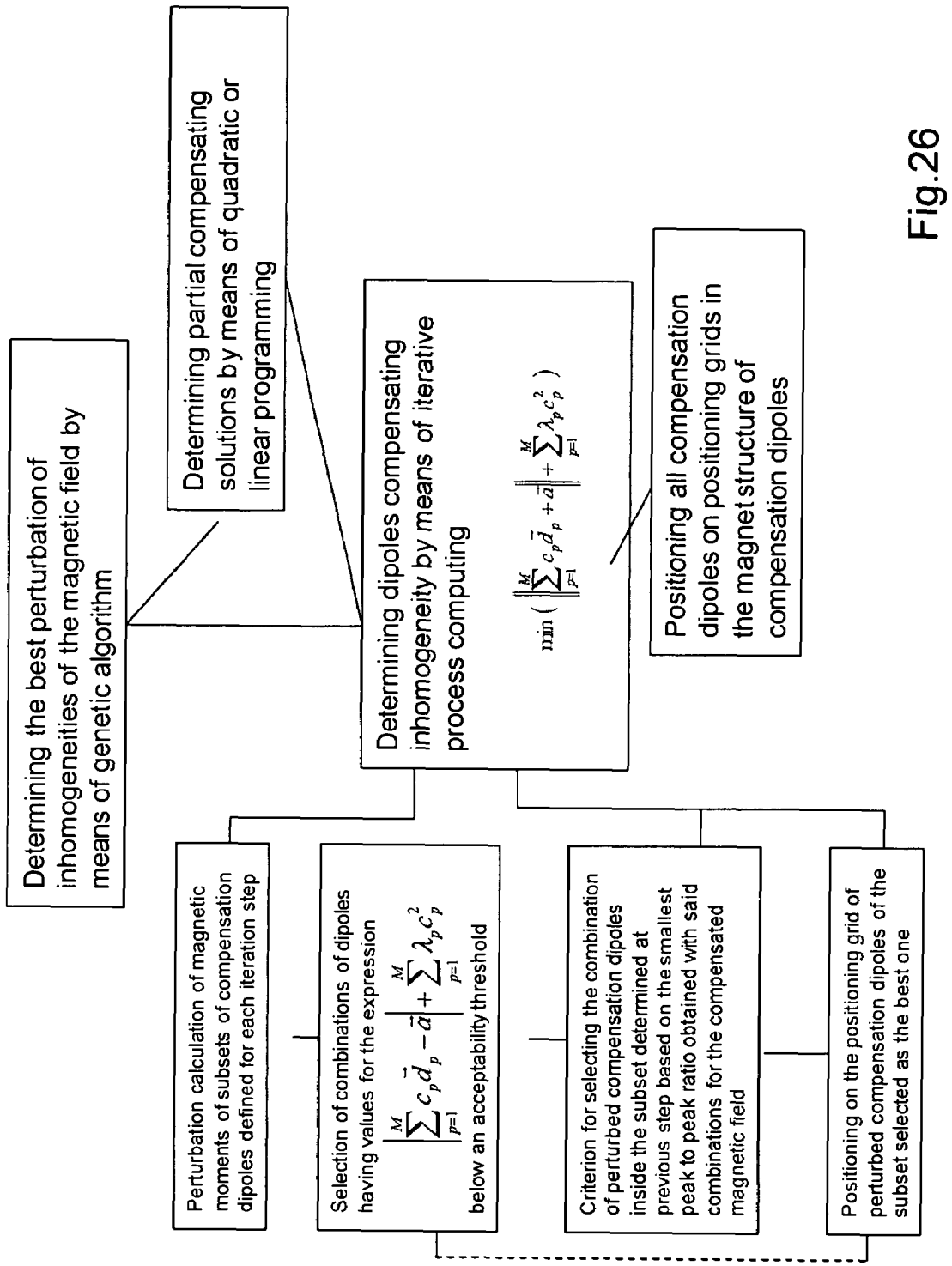
FIG. 26 shows a generic diagram of possible variants that the method according to the invention allows to go through in combination or alternatively one with respect to the other.

Once one or more perturbation configurations optimized according to what said hereinbefore is achieved it is possible to carry out the computation of compensation dipoles according to one or more above variants or improvements as indicated by diagram of FIG. 26. Fitness refers to the final magnetic field obtained after the compensation.

Figure 24:
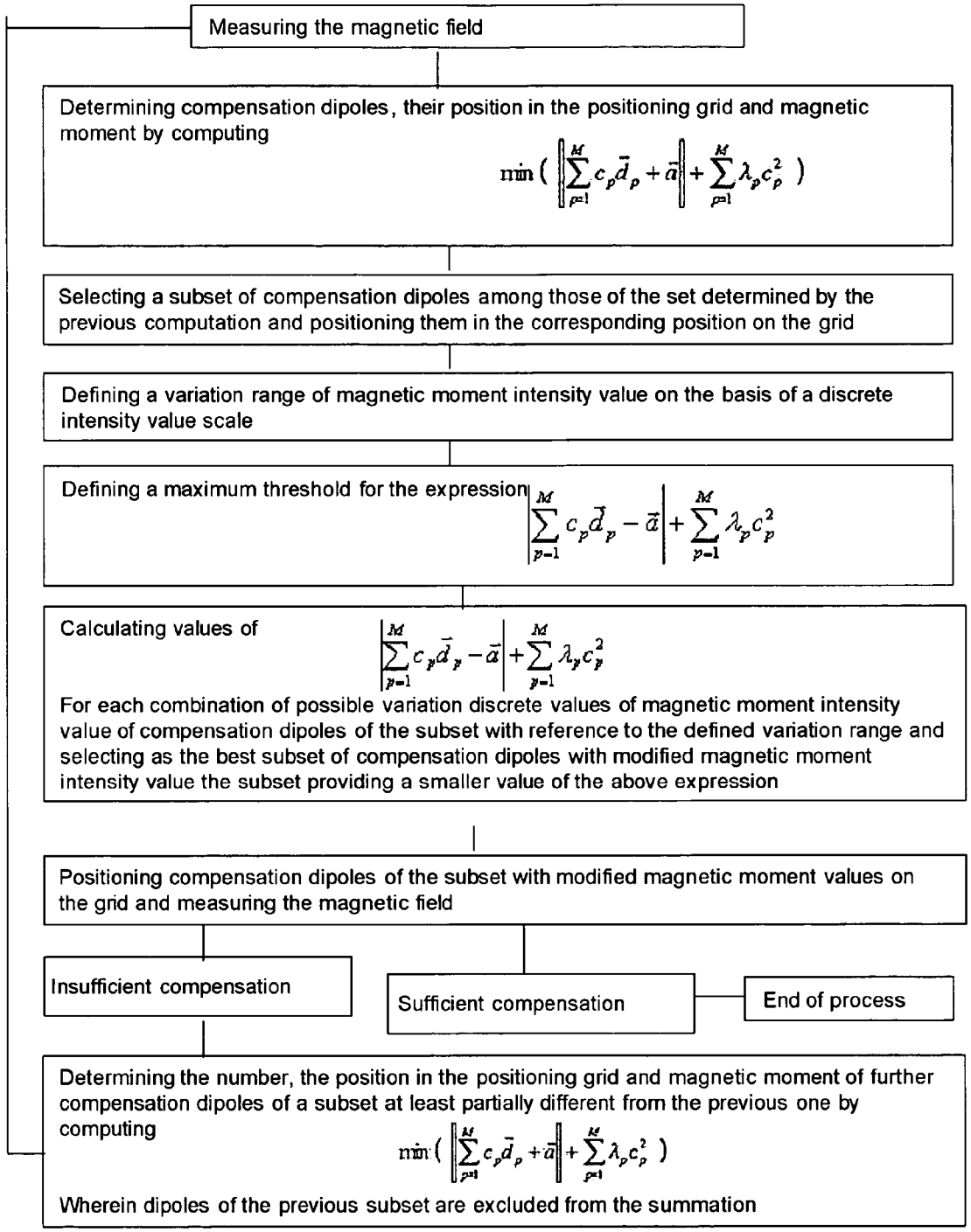
FIGS. 24A and B show a flow chart wherein iteration steps according to the method of FIG. 23 comprise even steps perturbating magnetic moment intensity values of compensation dipoles according to the method of FIG. 4 and respectively two variants of criteria for selecting the combination of compensation dipoles having perturbed magnetic moment intensity values among possible various combinations, in FIG. 24B there being shown only a Dart of the flow chart of FIG. 24A.
Figure 24:
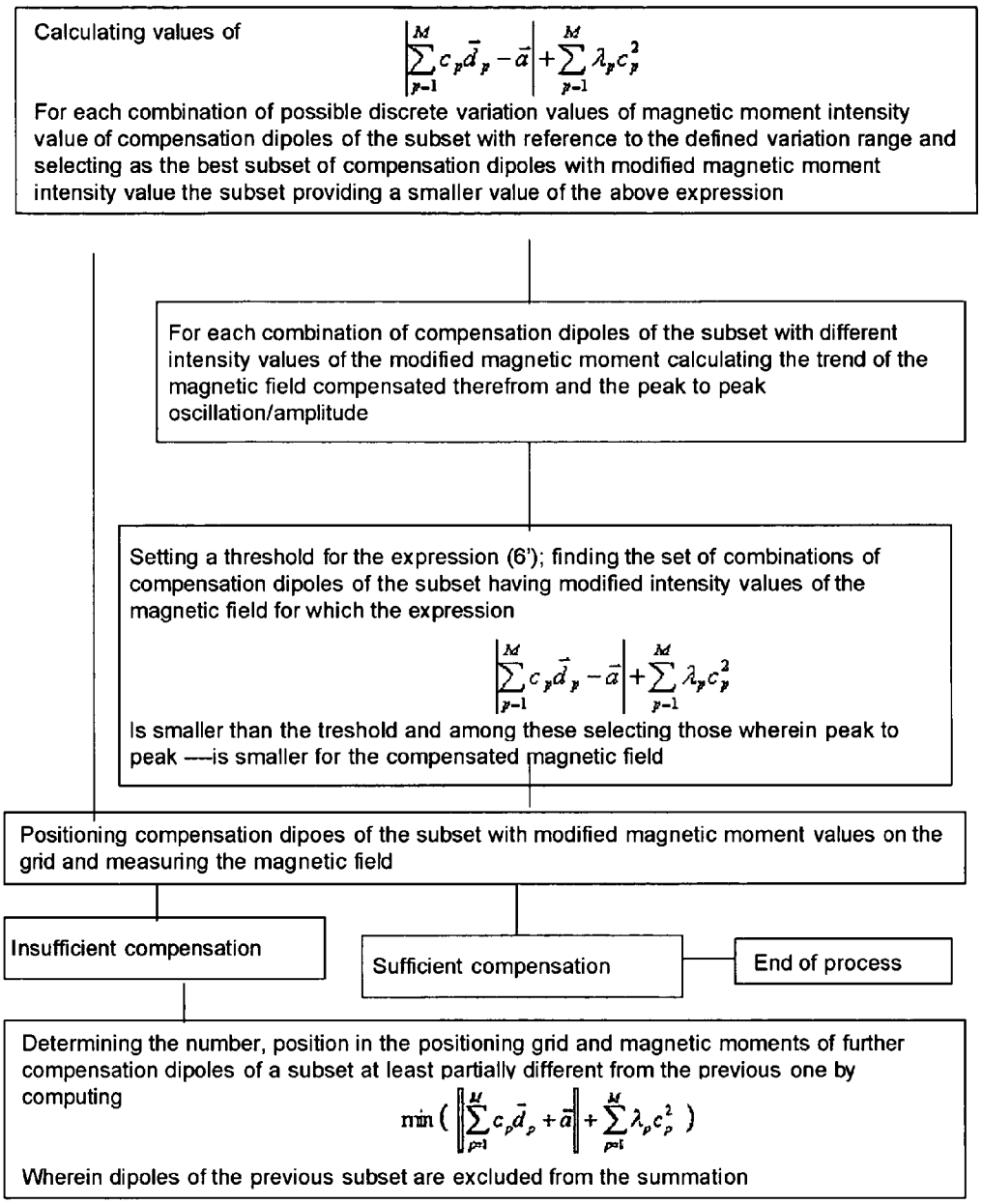

After having determined the starting perturbed field with regards to homogeneity it is possible to pass directly to the computation of compensation dipoles by means of iterative steps minimizing the expression (6) according to the flow chart of FIG. 24 or to introduce one or both perturbation and selecting criteria according to variants of flow charts of FIGS. 23 and 24 or it is possible among iterative steps minimizing the expression (6) to insert computational steps with quadratic or linear programming algorithm according to the flow chart of FIG. 25.

Finally the method according to the invention allows to optimize the choice of the compensating solution among many solutions that compensate inhomogeneities of the magnetic field below certain predetermined values regarding solutions that in addition to satisfy the acceptability criterion provide also other advantages such as the restriction of the total magnetic moment of compensating members and/or the optimization of the distribution of components of the residual vector and so the optimization of the magnetic field morphology.

The invention claimed is:

1. A method for correcting inhomogeneity of a static magnetic field generated by a magnetic structure of a machine for acquiring nuclear magnetic resonance images, the method comprising:
   a) defining a surface enclosing a spatial volume permeated by the magnetic field of the magnetic structure;
   b) describing said surface by a system of three-dimensional coordinates;
   c) measuring a value of components of the magnetic field along at least one direction of said system of three-dimensional coordinates;
   d) describing the components of the magnetic field along at least one direction by a series expansion based on an orthogonal set of functions $f_n$ truncated at a predetermined finite maximum order;
   e) for at least one component of the magnetic field, defining an inhomogeneity vector whose components comprise coefficients of the series expansion of step (d), said vector describing a trend of the corresponding component of the magnetic field;
   f) from the measured value of at least one component of the magnetic field, obtaining numerical values of the components of the inhomogeneity vector;
   g) defining a multi-dimensional grid that defines a number of positioning points P, each having a predetermined position with respect to the spatial volume in which the magnetic field inhomogeneity is to be corrected;
   h) defining an effect vector $\vec{d}_p$ that describes an effect of a component of a magnetic field of a dipole $D_p$ positioned in any of the positioning points P on the corresponding component of the magnetic field in the spatial volume, wherein components of the effect vector $\vec{d}_p$ comprise coefficients of a series expansion that describes said component of the magnetic field generated by said dipole based on a set of orthogonal functions $f_n$ truncated at an order no less than the order of the series describing the magnetic field in the spatial volume;
   i) defining a linear combination of the effect vectors of each of said dipoles $D_p$ describing a combined effect on at least one component of the magnetic field in the spatial volume generated by a set of the dipoles each lying in a different position on the grid and each provided with a magnetic moment;
   j) determining a number, position and magnetic moment of compensation magnetic dipoles that minimize a norm of a difference between said linear combination of effect vectors of said dipoles and the inhomogeneity vector of the corresponding component of the magnetic field in the spatial volume;
   k) positioning said compensation dipoles on the grid in corresponding positions;
   wherein a function is minimized such that a total magnetic moment of said compensation dipoles for compensating the magnetic field inhomogeneity is minimized and said norm of the difference between the inhomogeneity vector of each component of the magnetic field and the linear combination of effect vectors corresponding to said component of the magnetic field of said compensation dipoles is minimized.

2. The method according to claim 1, wherein said total magnetic moment of compensation dipoles is expressed also as a sum of squares of coefficients of said linear combination suitably individually weighed in a different way, which coefficients are correlated, particularly proportional to magnetic moments of each corresponding compensation dipole.

3. The method according to claim 1, wherein the number of dipoles, the magnetic moment value thereof and the position thereof is obtained by the following operation:

$$\min\left(\left\|\sum_{p=1}^{M} c_p \vec{d}_p + \vec{a}\right\| + \sum_{p=1}^{M} \lambda_p c_p^2\right),$$

wherein d is inhomogeneity vector of the magnetic field whose components are composed of coefficients $a_1, \ldots, a_N$ of the series expansion and whose modulus corresponds to measured inhomogeneity, $\vec{d}_p$ is effect vector of each dipole $D_p$ in the positioning point p and comprises components $d_{1,p}, \ldots, d_{N,p}$, coefficient $c_p$ is proportional to the magnetic moment value of each dipole having coefficient different from zero and position p in the positioning grid, and coefficients $\lambda_p$ are a priori and empirically set following selection criteria based on effects that such coefficient has on the magnetic moment of each dipole.

4. The method according to claim 3, wherein a first selection criterion consists in estimating the action of coefficient $\lambda_p$ as an amplifier/attenuator of the efficacy that the corresponding dipole at position p exerts on the magnetic field, the definition of values of coefficients $\lambda_p$ being carried out empirically by test and trials or by heuristic means or on experimental-based, there being always necessary for the dipole set, magnetic moments thereof and coefficients $\lambda_p$ to satisfy minimizing conditions of the expression $$\min\left(\left\|\sum_{p=1}^{M} c_p \vec{d}_p + \vec{a}\right\| + \sum_{p=1}^{M} \lambda_p c_p^2\right)$$

wherein $\vec{a}$ is the inhomogeneity vector of the magnetic field whose components are composed of coefficients $a_1, \ldots a_N$ of the series expansion and whose modulus corresponds to measured inhomogeneity; $\vec{d}_p$ is the effect vector of each dipole $D_p$ in the positioning point P and it comprises components $d_{1,p}, \ldots, d_{N,p}$ and the coefficient $c_p$ is proportional to the magnetic moment value of each dipole having coefficient different from zero and position p in the positioning grid.

5. The method according to claim 3, wherein a further criterion for selecting coefficients $\lambda_p$ is based on the fact that said coefficients are selected so to reduce the total instability of the solution with which compensation dipoles are determined namely to prevent a compensating solution to be defined having compensation dipoles located at grid positions that are very close one with respect to the other and which dipoles have magnetic moments opposite in sign and with similar value or intensity.

6. The method according to claim 1, wherein the inhomogeneity compensation is carried out such that the variation of the intensity of the magnetic field in the spatial volume that has been considered considerable remains below a predetermined maximum threshold according to the following inequality:

$$\left(\left\|\sum_{p=1}^{M} c_p \vec{d}_p + \vec{a}\right\| + \sum_{p=1}^{M} \lambda_p c_p^2\right) \leq \text{threshold}$$

wherein the threshold value is an acceptability value provided for the application the magnetic structure is intended for and wherein $\vec{a}$ is the inhomogeneity vector of the magnetic field whose components are composed of coefficients $a_1, \ldots a_N$ of the series expansion and whose modulus corresponds to the measured inhomogeneity; $\vec{d}_p$ is the effect vector of each dipole $D_p$ in the positioning point p and it comprises components $d_{1,p}, \ldots, d_{N,p}$ and the coefficient $c_p$ is proportional to the magnetic moment value of each dipole having coefficient different from zero and position p in the positioning grid.

7. Method The method according to claim 1, further comprising:

a) by computing expression $$\min\left(\left\|\sum_{p=1}^{M} c_p \vec{d}_p + \vec{a}\right\| + \sum_{p=1}^{M} \lambda_p c_p^2\right)$$

or inequality $$\left(\left\|\sum_{p=1}^{M} c_p \vec{d}_p + \vec{a}\right\| + \sum_{p=1}^{M} \lambda_p c_p^2\right) \leq \text{threshold}$$

determining the combination of compensation dipoles, positions thereof on the positioning grid and the magnetic moment value of said dipoles that constitutes a solution of said expression;

b) choosing a subset of said compensation dipoles composed of a certain number of dipoles that is smaller than the total number determined at step a);

c) positioning said dipoles of said subset in corresponding predetermined positions of the positioning grid giving magnetic moments determined at step a) to said dipoles;

d) carrying out a measurement of the magnetic field along at least the surface enclosing the spatial volume or in said spatial volume wherein the magnetic field is to be compensated with respect to possible inhomogenities or e) repeating the computing step of point a)

f) determining a new subset of compensation dipoles at least a part of them being different as regards position and/or magnetic moment than those of the subset of compensation dipoles previously determined and already positioned on the positioning grid at step c);

g) positioning said dipoles of the new subset in the corresponding predetermined positions of the positioning grid giving corresponding magnetic moments resulting from the computation to said dipoles;

h) repeating steps d) to g) till all compensation dipoles resulting from the computation of the minimizing expression are positioned on the positioning grids, wherein $\vec{a}$ is inhomogeneity vector of the magnetic field whose components are composed of coefficients $a_1, \ldots a_N$ of the series expansion and whose modulus corresponds to measured inhomogeneity, $\vec{d}_p$ is effect vector of each dipole $D_p$ in the positioning point p and comprises components $d_{1,p}, \ldots, d_{N,p}$, $c_p$ is proportional to the magnetic moment value of each dipole having coefficient different from zero and position p in the positioning grid, and $\lambda_p$ are a priori and empirically set following selection criteria based on effects that such coefficient has on the magnetic moment of each dipole.

8. Method The method according to claim 7, wherein when computing the expression $$\min\left(\left\|\sum_{p=1}^{M} c_p \vec{d}_p + \vec{a}\right\| + \sum_{p=1}^{M} \lambda_p c_p^2\right)$$

or the inequality $$\left(\left\|\sum_{p=1}^{M} c_p \vec{d}_p + \vec{a}\right\| + \sum_{p=1}^{M} \lambda_p c_p^2\right) \leq \text{threshold}$$

for a subsequent iteration step, values relevant to compensation dipoles already positioned in previous iteration step or steps are not more considered, considering the effect thereof by measuring the magnetic field for determining a new inhomogeneity vector.

9. The method according to claim 7, wherein apart from the fact that in previous iteration step or steps some compensation dipoles included in subsets of compensation dipoles defined for each previous iteration step have been positioned on the positioning grid, when computing the expression $$\min\left(\left\|\sum_{p=1}^{M} c_p \vec{d}_p + \vec{a}\right\| + \sum_{p=1}^{M} \lambda_p c_p^2\right)$$

or the inequality $$\left(\left\|\sum_{p=1}^{M} c_p \vec{d}_p + \vec{a}\right\| + \sum_{p=1}^{M} \lambda_p c_p^2\right) \leq \text{threshold}$$

even said compensation dipoles are reconsidered as variables to be determined that have been already previously positioned on the positioning grid, so that such computation can lead to a solution providing at least one or more compensation dipoles that are in a position that coincides with one or more compensation dipoles determined and positioned on the positioning grid in the previous iteration step or steps and to compensation dipoles already previously positioned in previous iteration step or steps being added the magnetic moment value computed in subsequent or each subsequent iteration steps for compensation dipoles determined in said subsequent iteration step or steps and coinciding with said dipoles already positioned on the positioning grid in previous iteration step or steps.

10. The method according to claim 7, wherein when computing the expression $$\min\left(\left\|\sum_{p=1}^{M} c_p \vec{d}_p + \vec{a}\right\| + \sum_{p=1}^{M} \lambda_p c_p^2\right)$$

or inequality $$\left(\left\|\sum_{p=1}^{M} c_p \vec{d}_p + \vec{a}\right\| + \sum_{p=1}^{M} \lambda_p c_p^2\right) \leq \text{threshold}$$

values relevant to compensation dipoles already positioned in a previous iteration step or steps are not considered in a subsequent iteration step or steps in a first alternative, and values relevant to compensation dipoles already positioned in a previous iteration step or steps are re-considered in a subsequent iteration step or steps in a second alternative, and the first alternative or the second alternative is automatically chosen based on whether the chosen alternative generates an accentable compensation with respect to the maximum variation threshold of the magnetic field intensity provided for the application the magnetic structure is intended for.

11. The method according to claim 7, wherein in one or more iteration steps values relevant to compensation dipoles already positioned in a previous iteration step or steps are not considered in a subsequent iteration step or steps, and in one or more further iterative compensation steps values relevant to compensation dipoles already positioned in a previous iteration step or steps are re-considered in a subsequent iteration step or steps, the sequence of said iterative compensating steps being alternated with respect to one another.

12. The method according to claim 7, wherein the search within the space of acceptable solutions of the expression $$\min\left(\left\|\sum_{p=1}^{M} c_p \vec{d}_p + \vec{a}\right\| + \sum_{p=1}^{M} \lambda_p c_p^2\right)$$

or inequality $$\left(\left\|\sum_{p=1}^{M} c_p \vec{d}_p + \vec{a}\right\| + \sum_{p=1}^{M} \lambda_p c_p^2\right) \leq \text{threshold},$$

alternatively or in combination, of the set of compensation dipoles having magnetic moment intensity values according to discrete scale of intensity values of said magnetic moment which scale is set in advance by the user and of the compensation dipole set providing a trend of the compensated magnetic field with the smallest peak to peak oscillation/amplitude or anyway below a predetermined maximum threshold also defined in advance by the user is carried out in one or more compensating iteration steps.

13. The method according to claim 12, wherein the search within the space of acceptable solutions of the expression $$\min\left(\left\|\sum_{p=1}^{M} c_p \vec{d}_p + \vec{a}\right\| + \sum_{p=1}^{M} \lambda_p c_p^2\right)$$

or inequality $$\left(\left\|\sum_{p=1}^{M} c_p \vec{d}_p + \vec{a}\right\| + \sum_{p=1}^{M} \lambda_p c_p^2\right) \leq \text{threshold},$$

alternatively or in combination, comprises determining the set of compensation dipoles having magnetic moment intensity values according to discrete scale of intensity values of said magnetic moment which scale is set in advance by the user and the compensation dipole set providing a trend of the compensated magnetic field with the smallest peak to peak oscillation/amplitude or below a predetermined maximum threshold defined in advance by the user for each iteration step and wherein the subset of compensation dipoles that have been chosen for a previous iteration step are positioned on the positioning grid before carrying out the subsequent iteration step.

14. The method according to claim 7, wherein it provides the further following steps:
 a) for at least one or at least some or for all iteration steps and for each compensation dipole of the compensation dipole subset chosen in said iteration step there is applied a perturbation calculation for magnetic moment intensity value determined in said iteration step with respect to values determined by the minimization of expression $$\min\left(\left\|\sum_{p=1}^{M} c_p \vec{d}_p + \vec{a}\right\| + \sum_{p=1}^{M} \lambda_p c_p^2\right),$$

which perturbation consists in modifying magnetic moment intensity value of each compensation dipole of said subset to such extent to increase and/or decrease magnetic moment intensity value of each one of said compensation dipoles of said subset leading it to a upper and/or smaller value coinciding with a magnetic moment intensity value provided in the predetermined discrete scale of magnetic moment intensity values and for each combination of variations of the magnetic moment intensity value of dipoles of compensation dipole subset there being calculated the value taken by the expression $$\left(\left\|\sum_{p=1}^{M} c_p \vec{d}_p + \vec{a}\right\| + \sum_{p=1}^{M} \lambda_p c_p^2\right) \leq \text{threshold}$$

depending on said perturbation of magnetic moment intensity values of dipoles of said subset and said value being compared with a threshold value correlated to or proportional to the maximum acceptable variation value of the corresponding component of the magnetic field;

b) finally as compensation dipoles of the subset with modified or perturbed magnetic moment intensity values being selected those dipoles included in said compensation dipoles of the subset having modified or perturbed magnetic moment value which satisfy the inequality $$\left(\left\|\sum_{p=1}^{M} c_p \vec{d}_p + \vec{a}\right\| + \sum_{p=1}^{M} \lambda_p c_p^2\right) \leq \text{threshold}$$

and particularly which provide the best solution for the expression $$\min\left(\left\|\sum_{p=1}^{M} c_p \vec{d}_p + \vec{a}\right\| + \sum_{p=1}^{M} \lambda_p c_p^2\right)$$

that is the one with the smallest value.

15. The method according to claim 14, wherein to provide the perturbation of magnetic moment intensity value of each compensation dipole of the subset selected in the corresponding iteration step of the method compensating inhomogeneities, a range for the possible variation of the magnetic moment intensity value of compensation dipoles of the subset is selected, one limit of which corresponds to a magnetic moment intensity value defined by the discrete scale of magnetic moment intensity values which value is greater than or equal to the computed magnetic moment intensity value of compensation dipoles and the second limit corresponds to a magnetic moment intensity value defined by the discrete scale of magnetic moment intensity values which value is smaller than or equal to computed magnetic moment intensity value of compensation dipoles, a distance equal to one or more discrete steps of variation of magnetic moment intensity value according to the predetermined discrete scale of magnetic moment intensity being defined.

16. The method according to claim 15, further comprising the following steps:

a) by computing expression $$\min\left(\left\|\sum_{p=1}^{M} c_p \vec{d}_p + \vec{a}\right\| + \sum_{p=1}^{M} \lambda_p c_p^2\right)$$

determining the combination of compensation dipoles, positions thereof on the positioning grid and magnetic moment value of said dipoles which is a solution of said expression $$\min\left(\left\|\sum_{p=1}^{M} c_p \vec{d}_p + \vec{a}\right\| + \sum_{p=1}^{M} \lambda_p c_p^2\right);$$

b) selecting a subset of said compensation dipoles that is composed of a certain number of dipoles smaller or equal to the total number determined at step a);

c) defining a discrete scale of magnetic moment intensity values for compensation dipoles of the subset defined at step b), which scale has discrete variation steps of magnetic moment intensity according to a predetermined scale of discrete variation steps of the magnetic moment that for example is a linear, quadratic, exponential, logarithmic one or any other scale;

d) based on said discrete scale of magnetic moment intensity values defining a variation range $\delta c_p$ of magnetic moment intensity value for each compensation dipole of said subset, such range being delimited by a magnetic moment intensity value greater or equal to and a magnetic moment intensity value smaller or equal to the value computed for each compensation dipole of said subset;

e) generating one after the other or at the same time all possible combinations of compensation dipoles of said subset having magnetic moment intensity value modified to discrete values included in the defined variation range;

f) for each of said different combinations of compensation dipoles generated at step e) carrying out the minimization of expression $$\min\left(\left\|\sum_{p=1}^{M} c_p \vec{d}_p + \vec{a}\right\| + \sum_{p=1}^{M} \lambda_p c_p^2\right)$$

with respect to variables composed of the value of remaining compensation dipoles of compensation dipole set computed at step a);

g) as the best solution for the combination of compensation dipoles having the modified magnetic moment intensity value generated at step e) and being part of said subset defining the compensation dipole combination with modified magnetic moment intensity value that provides the minimum value of expression $$\min\left(\left\|\sum_{p=1}^{M}c_p\vec{d}_p+\vec{a}\right\|+\sum_{p=1}^{M}\lambda_p c_p^2\right)$$

according to step f);

h) positioning said compensation dipoles of said subset defined at step g) in corresponding predetermined positions of the positioning grid giving modified magnetic moment intensity values to said dipoles;

i) carrying out a measurement of the magnetic field along a surface enclosing spatial volume wherein the magnetic field has to be compensated as regards possible inhomogeneities;

j) repeating computation step a);

k) determining a new subset of compensation dipoles at least part of which being different as regards position and/or magnetic moment than those of the compensation dipole subset previously determined and already positioned on the positioning grid at step h); and l) repeating steps c) to k) for the new subset defined at step k) till all compensation dipoles resulting from the computation of expression $$\min\left(\left\|\sum_{p=1}^{M}c_p\vec{d}_p+\vec{a}\right\|+\sum_{p=1}^{M}\lambda_p c_p^2\right)$$

are positioned on the positioning grid.

17. The method according to claim 16, wherein the discrete scale of magnetic moment intensity values for compensation dipoles of the subset defined at step b), may be also defined in such a manner to have discrete variation steps of magnetic moment intensity that are identical one with respect to the other and equal to a unit value of magnetic moment intensity or to a fraction of said unit value or to a multiple of said unit value.

18. The method according to claim 16, wherein for each iteration step, both the discrete scale of magnetic moment intensity values of compensation dipoles of the subset as regards the iteration step in progress and/or the variation range of magnetic moment intensity values of said compensation dipoles, as well as in case discrete variation steps of said magnetic moment intensity values are defined even in a specific and different way than other iteration steps.

19. The method according to claim 16, wherein as regards an iteration step there are defined variation ranges of the magnetic moment intensity value and/or even discrete variation steps of the magnetic moment intensity value that are different for each or for subgroup of compensation dipoles of the subset as regards the iteration step in progress.

20. The method according to claim 1, wherein it provides to identify in said space of solutions of expression $$\min\left(\left\|\sum_{p=1}^{M}c_p\vec{d}_p+\vec{a}\right\|+\sum_{p=1}^{M}\lambda_p c_p^2\right)$$

or inequality $$\left(\left\|\sum_{p=1}^{M}c_p\vec{d}_p+\vec{a}\right\|+\sum_{p=1}^{M}\lambda_p c_p^2\right)\le \text{threshold},$$

the solution defining the set of compensation dipoles satisfying the condition of limiting the intensity value of the magnetic moment of compensation dipoles to discrete values according to a discrete variation scale of said values and/or the condition of a trend of the compensated field with a peak to peak oscillation/amplitude as small as possible or within a predetermined tolerance.

21. The method according to claim 20, wherein the compensation dipole combination whose magnetic moments differ only according to discrete steps based on minimum steps of a magnetic moment unit or one or more fractions of an intensity unit value of the magnetic moment is determined.

22. The method according to claim 20, wherein the compensation dipole combination providing to generate a magnetic field having field local variations having a small peak to peak oscillation/amplitude is determined.

23. The method according to claim 1, wherein for each combination of all possible combinations of compensation dipoles of the compensation dipole subset defined for a certain iteration step and having magnetic moment intensity value modified to discrete values included in the defined variation range, the value of expression $$\min\left(\left\|\sum_{p=1}^{M}c_p\vec{d}_p+\vec{a}\right\|+\sum_{p=1}^{M}\lambda_p c_p^2\right)$$

obtained with said compensation dipole combination is computed and the function describing the trend of the compensated field and the peak to peak oscillation/amplitude of said function are calculated, while the combination of compensation dipoles of the subset that have the modified magnetic moment intensity value satisfying the inequality expression $$\left(\left\|\sum_{p=1}^{M}c_p\vec{d}_p+\vec{a}\right\|+\sum_{p=1}^{M}\lambda_p c_p^2\right)\le \text{threshold}$$

and providing a compensated magnetic field with the smallest peak to peak oscillation/amplitude and/or providing the smallest value for the expression $$\min\left(\left\|\sum_{p=1}^{M}c_p\vec{d}_p+\vec{a}\right\|+\sum_{p=1}^{M}\lambda_p c_p^2\right)$$

is selected as the best solution, wherein $\vec{a}$ is inhomogeneity vector of the magnetic field whose components are composed of coefficients $a_1, \ldots, a_N$ of the series expansion and whose modulus corresponds to measured inhomogeneity, $\vec{d}_p$ is effect vector of each dipole $D_p$ in the positioning point p and comprises components $d_{1,p}, \ldots, d_{N,p}$, $c_p$ is proportional to the magnetic moment value of each dipole having coefficient different from zero and position p in the positioning grid, and $\lambda_p$ are a priori and empirically set following selection criteria based on effects that such coefficient has on the magnetic moment of each dipole.

24. The method according to claim 1, wherein the magnetic structure has a symmetry according to an axis and the positioning grid is composed of a two-dimensional plane formed with concentric rings and radial lines, the magnetic moment determined for each radius being distributed on all the circumference of a ring having said radius.

25. The method according to claim 1, wherein step (i) comprises the following steps:

i1) defining as the compensating residual vector $\vec{\rho}$ with components $\rho_l, \ldots \rho_N$ the vector of the difference of the inhomogeneity vector $\vec{a}$ and of effect vector $\vec{d}$ defined as vectors having components $a_1, \ldots a_n$ and $d_1, \ldots, d_n$ respectively of the series expansion on the basis of orthogonal functions of the compensated magnetic field and of the magnetic field generated by compensation dipoles;

i2) for the value of each component $\rho_l, \ldots \rho_N$ of residual vector $\vec{\rho}$ imposing a corresponding value of maximum acceptable threshold $S_1, \ldots, S_N$;

i3) imposing an acceptable maximum value for each magnetic moments $c_p$ of individual compensation dipoles;

i4) calculating the number, the position in the positioning grid and the value of corresponding magnetic moments of one or more combinations of compensation dipoles satisfying conditions defined at steps i2) and i3);

i5) selecting among one or more combinations of compensation dipoles calculated at step i4) the one that provides the smallest value for the sum of magnetic moment squares of compensation dipoles;

i6) arranging compensation dipoles determined at step i5) with the corresponding magnetic moments in corresponding positions in the positioning grid; and i7) repeating steps a) to i).

26. The method according to claim 25, wherein at step i) in addition to minimizing said certain norm of the difference between the inhomogeneity vector of each individual component of the magnetic field and linear combination of effect vectors corresponding to said component of the magnetic field of compensation dipoles, the total magnetic moment of compensation dipoles provided for compensating inhomogeneity of magnetic field is also minimized.

27. The method according to claim 26, wherein at step i) the expression:

$$\min\left(\left\|\sum_{p=1}^{M} c_p \vec{d}_p + \vec{a}\right\| + \sum_{p=1}^{M} \lambda_p c_p^2\right)$$

is minimized, wherein $\vec{a}$ is inhomogeneity vector of the magnetic field whose components are composed of coefficients $a_l, \ldots a_N$ of the series expansion and whose modulus corresponds to measured inhomogeneity, $\vec{d}_p$ is effect vector of each dipole $D_p$ in the positioning point p and comprises components $d_{l,p}, \ldots, d_{N,p}, c_p$ is proportional to the magnetic moment value of each dipole having coefficient different from zero and position p in the positioning grid, and $\lambda_p$ are a priori and empirically set following selection criteria based on effects that such coefficient has on the magnetic moment of each dipole.

28. The method according to claim 27, wherein to calculate the value of $$\min\left(\left\|\sum_{p=1}^{M} c_p \vec{d}_p + \vec{a}\right\| + \sum_{p=1}^{M} \lambda_p c_p^2\right) \quad (6)$$

at step i) and in subsequent steps, one or more of combinations of the steps for compensating the magnetic field are carried out.

29. The method according to claim 25, wherein for each compensation dipole $D_1, \ldots, D_n$, a corresponding maximum threshold value $C_{threshold,1} \ldots C_{threshold,n}$ is defined, wherein the value of the magnetic moment $C_1, \ldots C_n$ of the corresponding compensation dipole $D_1, \ldots D_n$, is constrained to below the corresponding maximum threshold value.

30. The method according to claim 25, wherein steps from i1) to i7) are carried out in an iterative way by particularly repeating steps i2) to i5) modifying, generally reducing, each time at least some thresholds $S_1, \ldots, S_N$ for components $\rho_1, \ldots \rho_N$ of residual vector $\vec{\rho}$ and/or the maximum acceptable value for each magnetic moments $c_p$ of individual compensation dipoles.

31. The method according to claim 25, wherein steps i2) to i5) are repeated till constraints set by thresholds $S_1, \ldots S_N$ for components $\rho_1, \ldots \rho_N$ of residual vector $\vec{\rho}$ and/or by the maximum acceptable value for each magnetic moments $c_p$ of individual compensation dipoles allows to compute a solution or for a predetermined number of times allowing, at the end of the iterative repetition of steps i2) to i5) for the predetermined number of times and/or till the step that has given a solution, the continuation of the process with subsequent steps i6) and i7).

32. The method according to claim 25, wherein for the computation at step i4) the number, the position in the positioning grid and the value of corresponding magnetic moments of one or more combinations of compensation dipoles satisfying conditions defined at steps i2) and i3) are calculated using a quadratic programming algorithm or a linear programming algorithm.

33. The method according to claim 25, wherein the expression $$\sum_{p=1}^{M} \lambda_p c_p^2$$

is chosen to be minimized, and wherein $c_p$ is proportional to the magnetic moment value of each dipole having coefficient different from zero and position p in the positioning grid, and $\lambda_p$ are a priori and empirically set following selection criteria based on effects that such coefficient has on the magnetic moment of each dipole.

34. The method according to claim 25, wherein for each iteration of steps i2) to i5) a subset of compensation dipoles is defined to be positioned on the grid.

35. The method according to claim 25, wherein all compensation dipoles determined at first iterative step are positioned on the positioning grid and then a second measurement of the component under examination of the magnetic field is carried out for determining the inhomogeneity vector that will be used for a subsequent iteration step, alternatively in the subsequent iteration step being maintained or varied said first or second constraints and again all components of compensating vectors of all possible compensation dipoles being determined included those defined in the previous compensating step or in said iteration step the values related to compensation dipoles, to position thereof and/or magnetic moment thereof being determined which have not been included in the compensation dipole subset defined in the previous iteration step.

36. The method according to claim 35, wherein once the combination of compensation dipoles is defined within the second or a subsequent compensating step, a new subset of compensation dipoles is selected among compensation dipoles determined in the second or subsequent iteration step which at least partially do not coincide in position with compensation dipoles of the subset defined in the previous iteration step and said compensation dipoles of the new subset are positioned in corresponding positions of the positioning grid by repeating the measurement of the magnetic field and the computation steps until a solution is obtained.

37. The method according to claim 25, wherein initial iteration steps for determining compensation dipoles by means of quadratic or linear programming can provide in combination a modification for each subsequent iteration step consisting in a reduction of constraints such that the partial solution converges progressively towards a solution that is considered an optimum one.

38. The method according to claim 25, wherein it provides a different sequence of said iteration steps and wherein a certain number of iteration steps for determining compensation dipoles according to claim 25 is inserted to a certain number of minimizing steps according to one or more of combinations of steps.

39. The method according to claim 1, wherein before the compensating steps according to claim 1 are carried out, the following steps are carried out:
   a) generating an initial population of magnetic fields perturbed by means of perturbing fields different one with respect to the other and subjecting these perturbed magnetic fields to steps determining the combination of dipoles compensating said inhomogeneity, defining a fitness value of the solution calculated for each perturbed magnetic field regarding a known optimum solution;
   b) determining one better starting perturbed magnetic field by means of an algorithm combining perturbed magnetic fields of step a), for example a genetic algorithm to which there is provided as the starting population the population of perturbed magnetic fields that has been experimentally and accidentally determined, meaning that said perturbed magnetic field if used as the starting magnetic field for the iterative process determining the combination of dipoles compensating inhomogeneities provides a combination of compensation dipoles having a fitness value over a specific threshold and it satisfies all criteria or constraints of process steps according claim 1 for determining a compensation of the magnetic field.

* * * * *